(12) United States Patent
Yen et al.

(10) Patent No.: US 11,616,007 B2
(45) Date of Patent: Mar. 28, 2023

(54) ELECTRONIC PACKAGE

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW); Kay Stephan Essig, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/066,411

(22) Filed: Oct. 8, 2020

(65) Prior Publication Data

US 2022/0115310 A1 Apr. 14, 2022

(51) Int. Cl.

| H01L 23/48 | (2006.01) |
|---|---|
| H01L 23/498 | (2006.01) |
| H01L 21/48 | (2006.01) |
| H01L 23/31 | (2006.01) |
| H01L 21/56 | (2006.01) |

(52) U.S. Cl.
CPC .... *H01L 23/49822* (2013.01); *H01L 21/4857* (2013.01); *H01L 21/56* (2013.01); *H01L 23/3107* (2013.01); *H01L 23/49816* (2013.01)

(58) Field of Classification Search
CPC ............... H01L 23/49822; H01L 21/56; H01L 23/3107; H01L 23/49816
See application file for complete search history.

(56) References Cited

U.S. PATENT DOCUMENTS

| 8,432,033 | B2 | 4/2013 | Shinohara | |
|---|---|---|---|---|
| 9,293,338 | B2* | 3/2016 | Lin | .............. H01L 23/482 |
| 2009/0233436 | A1* | 9/2009 | Kim | ............... H01L 24/16 |
| | | | | 257/E21.476 |
| 2011/0101523 | A1* | 5/2011 | Hwang | ............ H01L 24/16 |
| | | | | 257/737 |
| 2011/0233761 | A1* | 9/2011 | Hwang | ............ H01L 24/16 |
| | | | | 257/E23.079 |
| 2012/0252168 | A1* | 10/2012 | Nah | ............. H01L 21/4853 |
| | | | | 257/E21.502 |
| 2013/0234315 | A1* | 9/2013 | Daubenspeck | ...... H01L 22/30 |
| | | | | 257/737 |
| 2014/0124928 | A1* | 5/2014 | Lin | ................ H01L 24/11 |
| | | | | 257/738 |
| 2016/0079193 | A1* | 3/2016 | Arvin | ............... H01L 24/11 |
| | | | | 438/614 |

* cited by examiner

*Primary Examiner* — Nicholas J Tobergte
(74) *Attorney, Agent, or Firm* — Foley & Lardner LLP

(57) ABSTRACT

An electronic package and method for manufacturing the same are provided. The electronic package includes a substrate and a wetting layer. The substrate includes a plurality of conductive step structures each including a first portion and a second portion. The first portion has a first bottom surface, a first outer surface and a first inner surface. The second portion has a second bottom surface, a second outer surface and a second inner surface, wherein the second portion partially exposes the first bottom surface. The wetting layer at least covers the second bottom surface, the second outer surface and the second inner surface of the second portion of each of the conductive step structures.

18 Claims, 33 Drawing Sheets

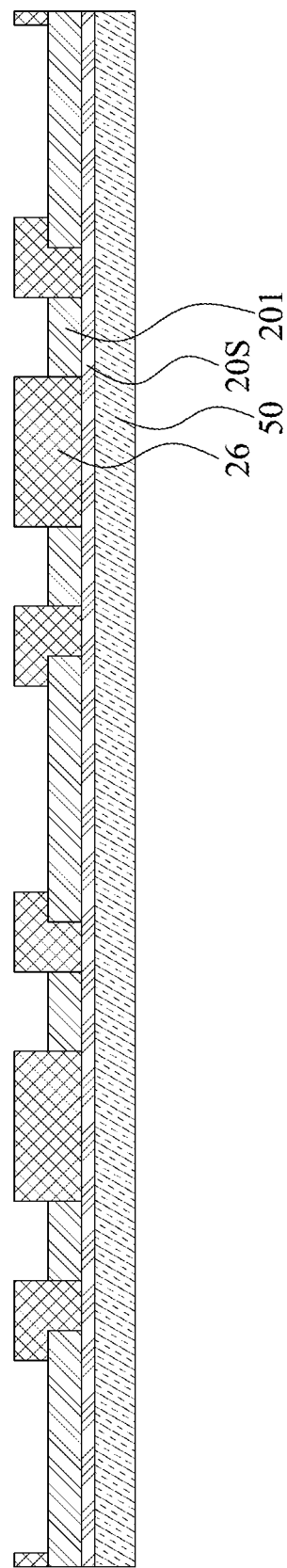

ELECTRONIC PACKAGE

BACKGROUND

1. Technical Field

The present disclosure relates to an electronic package and manufacturing method thereof, and more particularly, to an electronic package with wettable flanks formed by additive process and manufacturing method thereof.

2. Description of the Related Art

A wettable flank enables optical inspection on the electrical connection between an electronic component and a printed circuit board (PCB). The conventional wettable flank, however, is formed in a destructive manner such as cutting or etching. The cutting method results in dimension variation among different wettable flanks due to misalignment issue. The etching method leads to thickness variation because it is difficult to control etching parameters. It is therefore desirable to develop an electronic package with reliable wettable flanks.

SUMMARY

One aspect of the present disclosure relates to an electronic package. In some embodiments, the electronic package includes a substrate and a wetting layer. The substrate includes a plurality of conductive step structures each including a first portion and a second portion. The first portion has a first bottom surface, a first outer surface and a first inner surface. The second portion has a second bottom surface, a second outer surface and a second inner surface, wherein the second portion partially exposes the first bottom surface. The wetting layer at least covers the second bottom surface, the second outer surface and the second inner surface of the second portion of each of the conductive step structures.

Another one aspect of the present disclosure relates to an electronic package. In some embodiments, the electronic package includes a substrate. The substrate includes a circuit layer including a stack of a first conductive layer and a second conductive layer. The first conductive layer includes a first bottom surface and a first outer surface. The second conductive layer includes a second bottom surface and a second outer surface, the second conductive layer exposing a portion of the first bottom surface of the first conductive layer, thereby defining a conductive step structure. The second outer surface and the second bottom surface form a conductive path.

Another aspect of the present disclosure relates to a method of manufacturing an electronic package. In some embodiments, the method includes the following operations. A stack of conductive layers is formed by an additive process to define a conductive step structure. The stack of conductive layers is singulated along the conductive step structure to form an electronic package with the conductive step structure exposed from an edge of the electronic package.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 8A, FIG. 8B, FIG. 8C, FIG. 8D and FIG. 8E illustrate operations of manufacturing an electronic package in accordance with some embodiments of the present disclosure.

DETAILED DESCRIPTION

Figure 1:
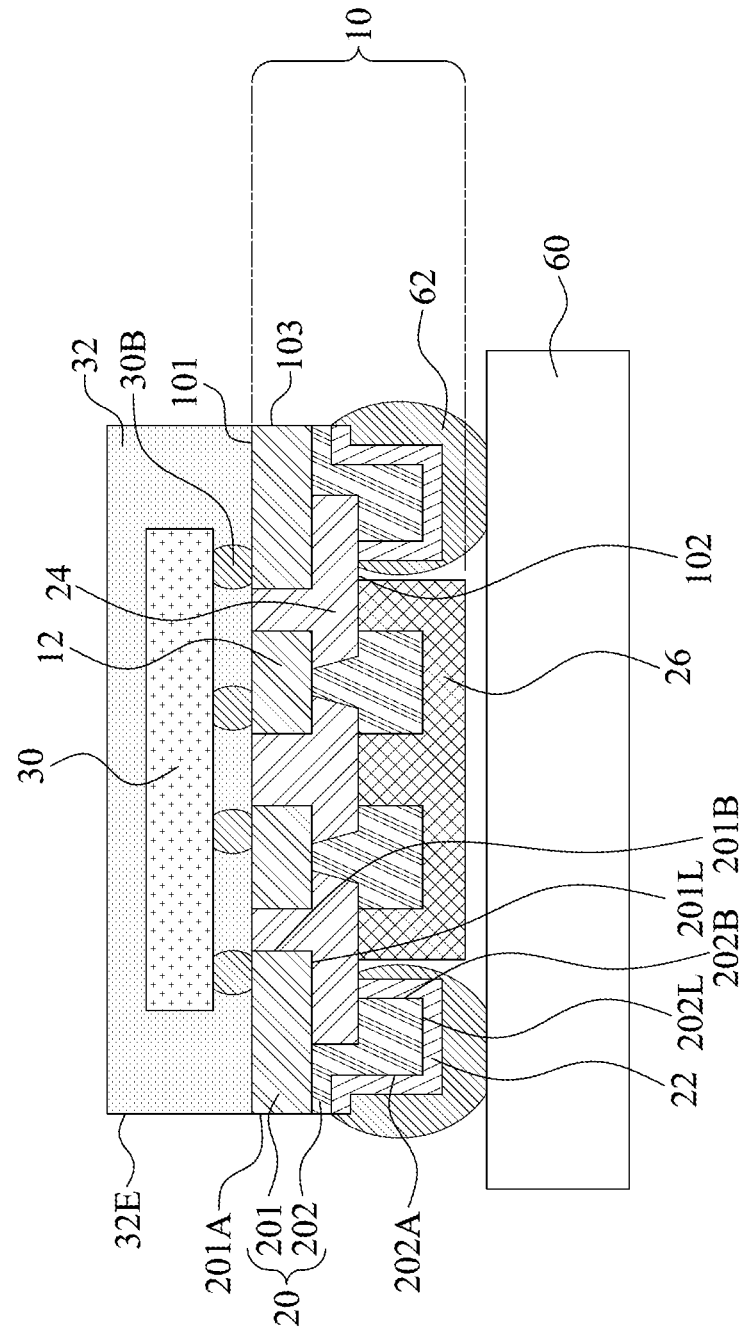
FIG. 1 is a schematic cross-sectional view of an electronic package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

FIG. 1 is a schematic cross-sectional view of an electronic package 1 in accordance with some embodiments of the present disclosure. As shown in FIG. 1, the electronic package 1 includes a substrate 10. In some embodiments, the substrate 10 may include a wiring substrate or a circuit substrate having a circuit layer 12 at least partially embedded in the substrate 10. By way of example, the substrate 10 may include an embedded trace substrate (ETS). The circuit layer 12 may include a substrate-level circuit layer, which is a low-density circuit layer with wider line width/line space (L/S). For example, the L/S of the circuit layer 12 may be equal to or greater than about 10 μm/about 10 μm. In some other embodiments, the substrate 10 may include a redistribution layer (RDL) or the like. The circuit layer 12 may include a bumping-level circuit layer, which is a high-density circuit layer with narrower L/S. For example, the L/S of the circuit layer 12 may be between about 2 μm/about 2 μm and about 10 μm/about 10 μm, or less than about 2 μm/about 2 μm.

The circuit layer 12 may include a stack of a first conductive layer 201 and a second conductive layer 202. The first conductive layer 201 includes a first bottom surface 201L, a first outer surface 201A and a first inner surface 201B. The second conductive layer 202 includes a second bottom surface 202L, a second outer surface 202A and a second inner surface 202B. The second conductive layer 202 may partially expose a portion of the first bottom surface 201L of the first conductive layer 201, thereby defining a conductive step structure 20. In some embodiments, the first conductive layer 201 may be referred to as a first portion of the conductive step structure 20, and the second conductive layer 202 may be referred to as a second portion of the conductive step structure 20. In some embodiments, the first conductive layer 201 and the second conductive layer 202 may be in direct contact with each other with an interface therebetween. In some other embodiments, the electronic package 1 may further include a seed layer between the first conductive layer 201 and the second conductive layer 202 of the conductive step structure 20. In some embodiments, the substrate 10 may further include at least one dielectric layer 24 disposed between the first conductive layer 201 and the second conductive layer 202. The conductive step structure 20 may penetrate through the dielectric layer 24. In some embodiments, the electronic package 1 may further include an insulative layer 26 such as a solder mask partially covering a bottom surface 102 of the substrate 10.

In some embodiments, a portion of the circuit layer 12 is exposed from a front surface 101 of the substrate 10, and configured as bonding pads. The electronic package 1 may further include at least one first electronic component 30 disposed on the front surface 101 of the substrate 10 and electrically connected to the circuit layer 12. By way of examples, the at least one first electronic component 30 may be electrically connected to the substrate 10 through solder bumps 30B in a flip chip manner. Alternatively or additionally, the at least one first electronic component 30 may be electrically connected to the substrate 10 by wire bonding. The electronic package 1 may further include a first encapsulant 32 disposed on the front surface 101 of the substrate 10 and encapsulating the at least one first electronic component 30. The first encapsulant 32 may include molding compound such as epoxy-based material (e.g. FR4, electronic molding compounds), resin-based material (e.g. Bis-maleimide-Triazine (BT)), ABF, Polyimide (PI)) or other suitable molding materials. In some embodiments, the first encapsulant 32 may further include fillers such as silicon oxide fillers dispensed in the molding material. The first encapsulant 20 may cover edges of the first electronic component 30 and an upper surface of the first electronic component 30. In some embodiments, an edge 32E of the first encapsulant 32 may be substantially coplanar with the first outer surface 201A of the first conductive layer 201.

In some embodiments, the substrate 10 includes a plurality of conductive step structures 20. The conductive step structures 20 may be arranged on at least one edge 103 of the substrate 10, for example, on one edge 103, two edges 103, three edges 103 or all edges 103 of the substrate 10. the conductive step structures 20 may, but are not limited to, be configured as wettable flanks of the electronic package 1. The wettable flanks are exposed terminal ends of the circuit layer 12, and can promote solder wetting for the formation of solder conductors 62 such as solder balls. As shown in FIG. 1, the conductive step structure 20 allows a portion of the solder conductor 62 being accommodated in the recess, and another portion of the solder conductor 62 wetting and laterally protruding out from the edge 103 of the substrate 10. Thus, the solder conductor 62 can engage with the conductive step structure 20 to increase the reliability and robustness of the electrical connection. The solder conductor 62 is visible when viewing from the front surface 101. Accordingly, the conductive step structure 20 may serve as wettable flank and enables optical inspection of the soldering, which can increase reliability and reduce cost. In some embodiments, the conductive step structures 20 may include metal material such as copper or an alloy thereof.

In some embodiments, the electronic package 1 further includes a wetting layer 22. The wetting layer 22 may at least cover the second bottom surface 202L, the second outer surface 202A and the second inner surface 202B of the second conductive layer 202 of the conductive step structures 20. By way of example, the wetting layer 22 may directly contact the second bottom surface 202L, the second outer surface 202A and the second inner surface 202B of the second conductive layer 202 of the conductive step structures 20. The wetting layer 22 may help to increase wetting of the conductive step structure 20 such that the solder conductor 62 can climb up the second outer surface 202A of the conductive step structure 20. In some embodiments, the solder conductor 62 may further cover the second inner surface 202B of the second conductive layer 202. The wetting layer 22 may also be an anti-oxidization film configured to prevent the conductive step structure 20 from being oxidized. In some embodiments, the wetting layer 22 may expose the first outer surface 201A and the first inner surface 201B. In some embodiments, the wetting layer 22 may include a single-layered wetting layer. By way of example, the wetting layer 22 may include an organic solderability preservative (OSP). Alternatively or additionally, the wetting layer 22 includes a solder-wettable material such as nickel/gold, solder or a mixture thereof. The solder conductors 62 may cover the wetting layer 22, and mounted on a circuit board 60 such as a printed circuit board (PCB). In some embodiments, the second conductive layer 202 covers a portion of the first bottom surface 201L adjacent to the first outer surface 201A of the first conductive layer 201, and the second outer surface 202A and the second bottom surface 202L can form a conductive path between the electrical conductor 62 and the first electronic component 30.

Figure 2A:
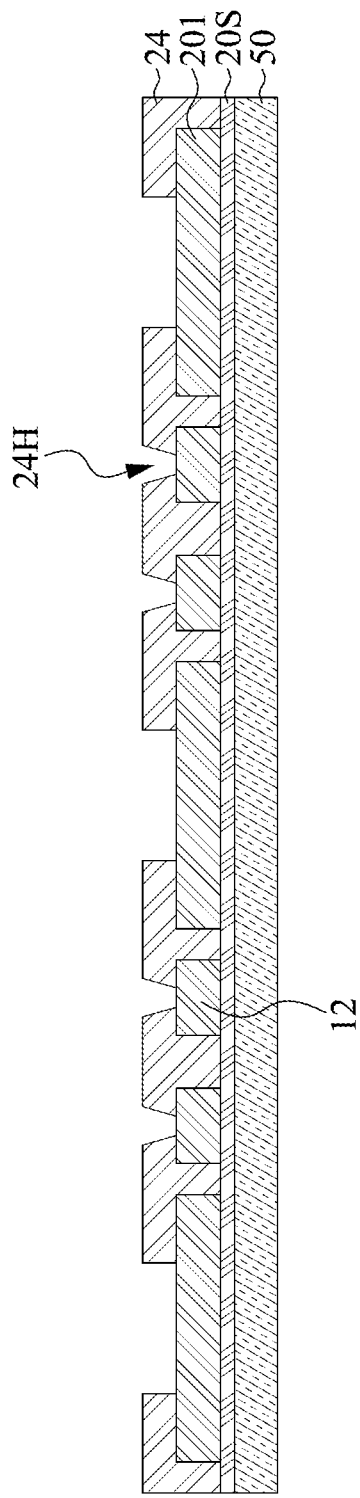
FIG. 2A, FIG. 2B, FIG. 2C, FIG. 2D and FIG. 2E illustrate operations of manufacturing an electronic package in accordance with some embodiments of the present disclosure.

FIG. 2A, FIG. 2B, FIG. 2C, FIG. 2D and FIG. 2E illustrate operations of manufacturing an electronic package 1 in accordance with some embodiments of the present disclosure. As shown in FIG. 2A, a first conductive layer 201 is formed on a temporary carrier 50. In some embodiments, the first conductive layer 201 may include a metal layer such as a copper layer, and can be formed by electroplating using a seed layer 20S. Subsequently, a dielectric layer 24 is formed on the first conductive layer 201. The dielectric layer 24 may include an organic material such as FR4, BT, ABF or PI, and can be formed by lamination. The dielectric layer 24 is then patterned by e.g., laser drilling to form openings 24H partially exposing the first conductive layer 201.

Figure 2B:
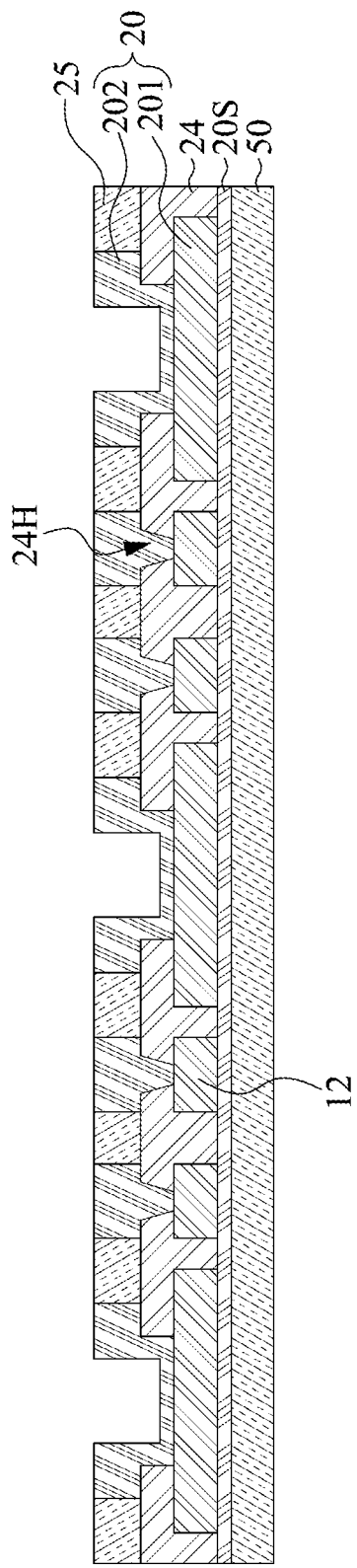

As shown in FIG. 2B, a sacrificial layer 25 may be formed on the dielectric layer 24. A second conductive layer 202 is then formed on the exposed first conductive layer 201 and the dielectric layer 24 exposed by the sacrificial layer 25 made of e.g., photoresist. In some embodiments, the second conductive layer 202 may include a metal layer such as a copper layer, and can be formed by electroplating. Accordingly, the stack of conductive layers e.g., the first conductive layer 201 and the second conductive layer 202 forms a circuit layer 12 and defines a plurality of conductive step structures 20.

Figure 2C:
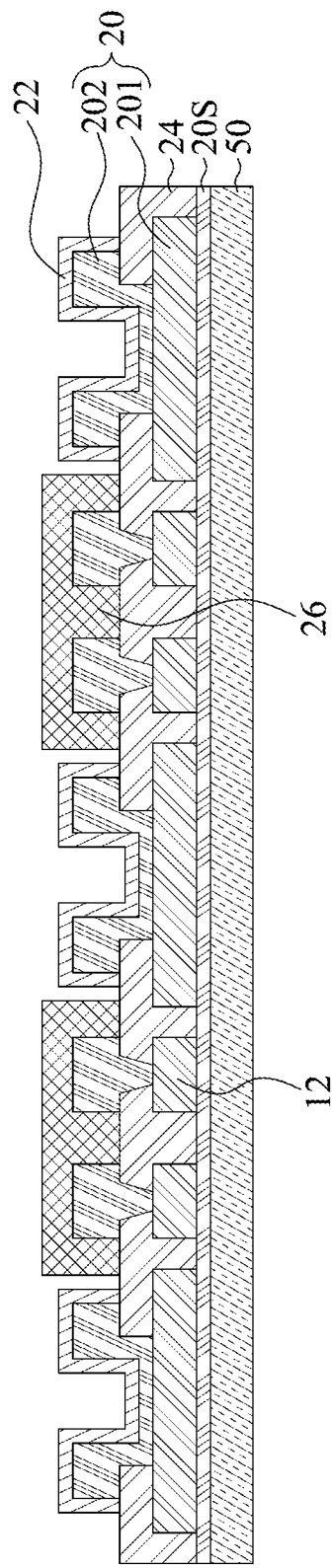
Figure 2D:
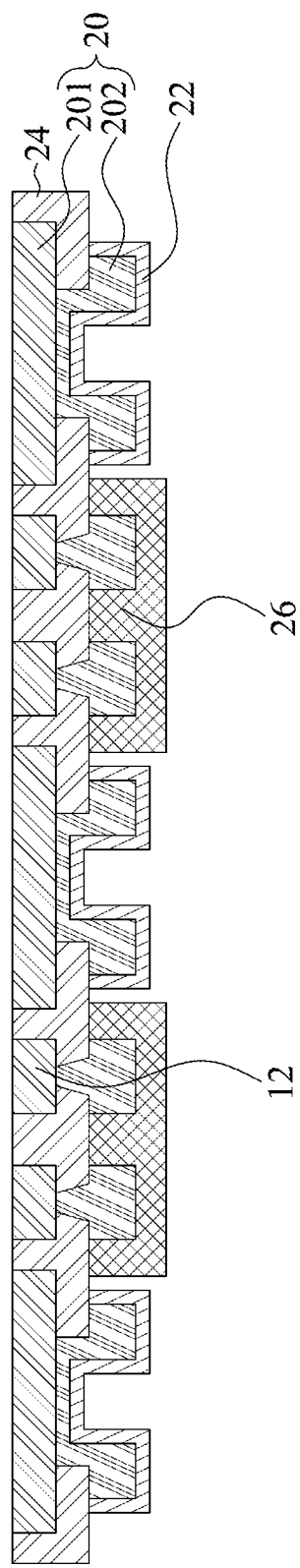

As shown in FIG. 2C, the sacrificial layer 25 is removed, and an insulative layer 26 such as a solder mask is formed to partially cover the second conductive layer 202. A wetting layer 22 is then formed on the second conductive layer 202 exposed by the insulative layer 26. As shown in FIG. 2D, the temporary carrier 50 is removed. The seed layer 20S is removed from the first conductive layer 201 by, e.g., etching or the like.

Figure 2E:
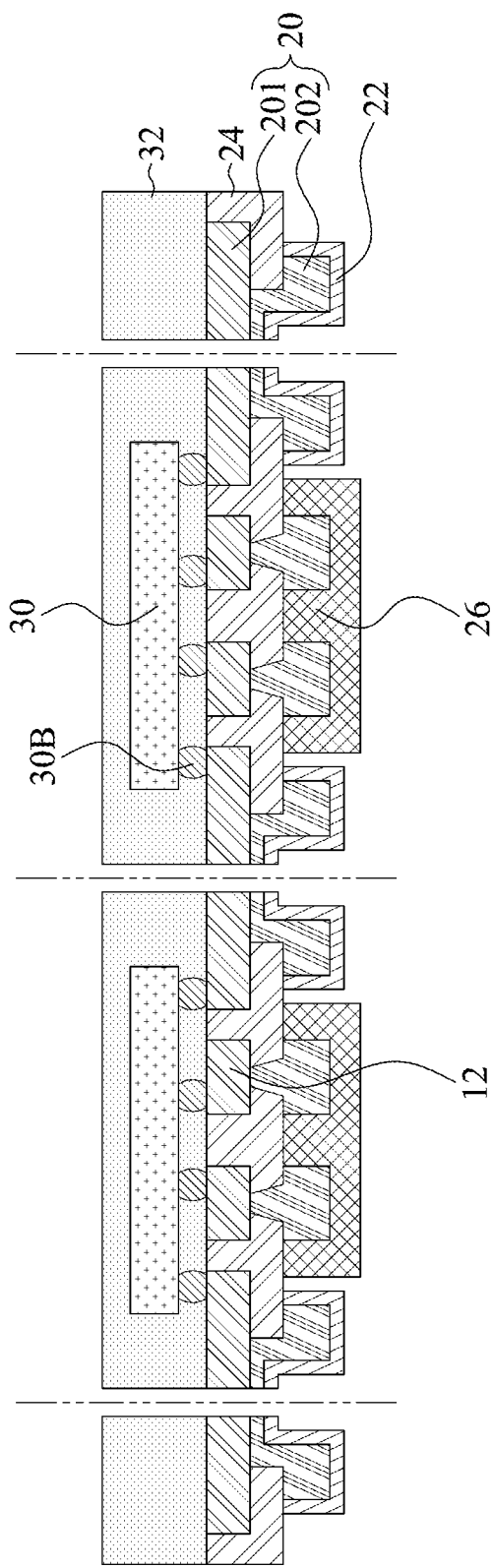

As shown in FIG. 2E, at least one first electronic component 30 is disposed on the first conductive layer 201. The first electronic component 30 may be electrically connected to the first conductive layer 201 through solder bumps 30B. A first encapsulant 32 is formed to encapsulate the at least one first electronic component 30 on the first conductive layer 201. The stack of the first conductive layer 201 and the second conductive layer 202 is singulated along the conductive step structure 20, and bonded to a circuit board 60 by solder conductors 62 to form an electronic package 1 with the conductive step structure 20 exposed from an edge 103 of the electronic package 1 as illustrated in FIG. 1. In some embodiments, a reflow process may be performed on the solder conductors 62 to melt the solder conductors 62 such that the joint between the solder conductors 62 and the circuit board 60 can be improved. As can be seen from FIGS. 2A-2E, the stack of the first conductive layer 201 and the second conductive layer 202 defines a plurality of conductive step structures 20. In addition, the conductive step structures 20 are defined by an additive process, i.e., the conductive step structure 20 is manufactured once the pattern of the first conductive layer 201 and the pattern of the second conductive layer 202 are defined. The singulation merely divide the plurality of conductive step structures 20, and no further destructive patterning process such as cutting and/or etching is required.

The electronic packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 3:
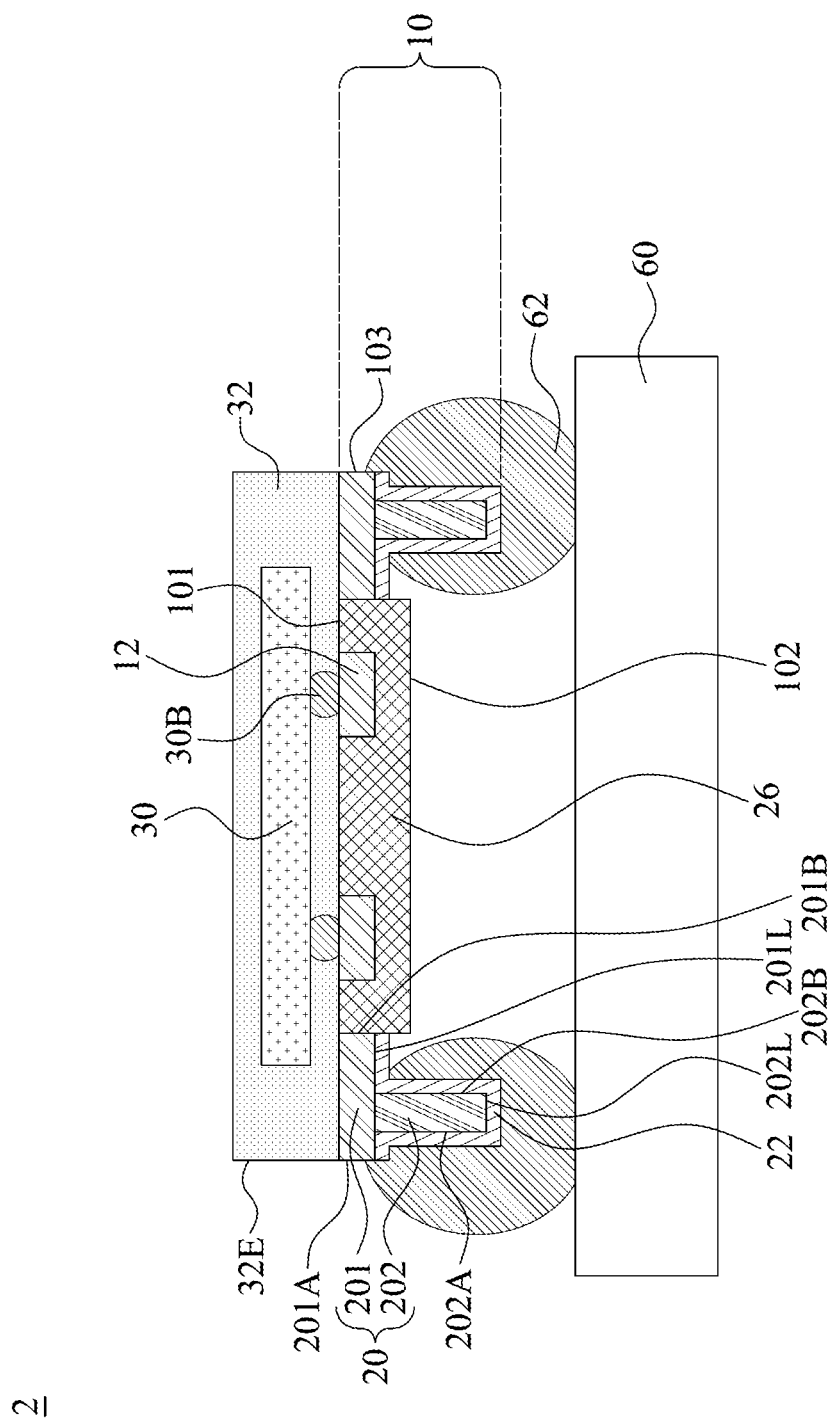
FIG. 3 is a schematic cross-sectional view of an electronic package in accordance with some embodiments of the present disclosure.

FIG. 3 is a schematic cross-sectional view of an electronic package 2 in accordance with some embodiments of the present disclosure. As shown in FIG. 3, in contrast to the electronic package 1 of FIG. 1, the dielectric layer 24 may be omitted. The second conductive layer 202 may cover the first bottom surface 201L in a middle section away from the first outer surface 201A and the first inner surface 201B of the first conductive layer 201. The wetting layer 22 may further cover a portion of the first bottom surface 201L. By way of example, the wetting layer 22 may directly contact a portion of the first bottom surface 201L.

Figure 3A:
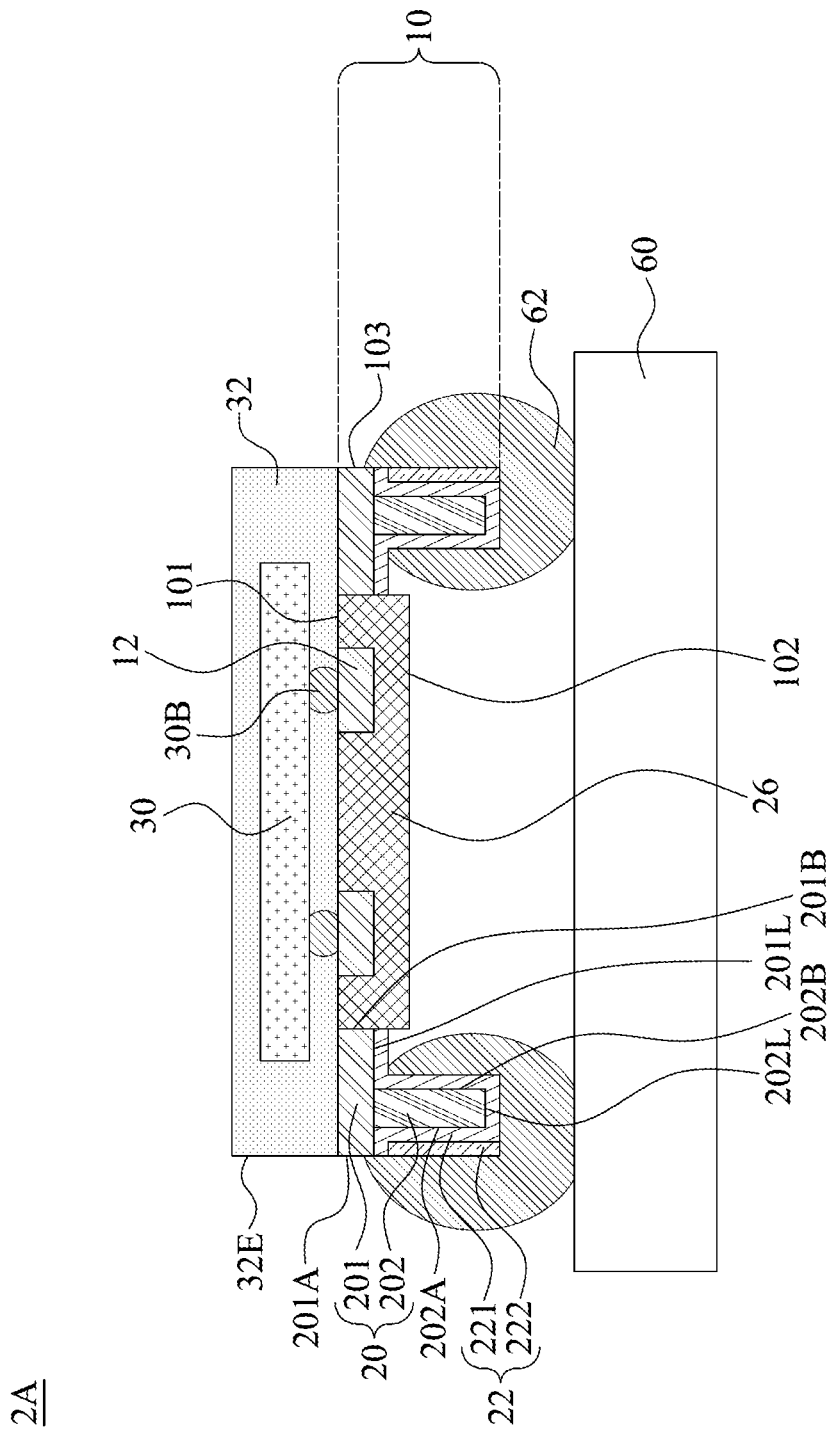
FIG. 3A is a schematic cross-sectional view of an electronic package in accordance with some embodiments of the present disclosure.

FIG. 3A is a schematic cross-sectional view of an electronic package 2A in accordance with some embodiments of the present disclosure. As shown in FIG. 3A, in contrast to the electronic package 2 of FIG. 3, the wetting layer 22 may include a multi-layered wetting layer including a first wetting layer 221 and a second wetting layer 222. The first wetting layer 221 and the second wetting layer 222 may include different materials. By way of example, the first wetting layer 221 may include an organic solderability preservative (OSP), and the second wetting layer 222 may include a solder-wettable material such as nickel/gold, solder or a mixture thereof. In some embodiments, the first wetting layer 221 may cover at least a portion of the first bottom surface 201L of the first conductive layer 201, and the second bottom surface 202L, the second outer surface 202A and the second inner surface 202B of the second conductive layer 202. The second wetting layer 222 may cover a portion of the first bottom surface 201L of the first conductive layer 201 and the second outer surface 202B of the second conductive layer 202. In an embodiment, in case the second wetting layer 222 includes solder material, the second wetting layer 222 and the respective solder conductor 62 may melt during the reflow process of the solder conductors 62, and then solidify as one conductor.

Figure 4A:
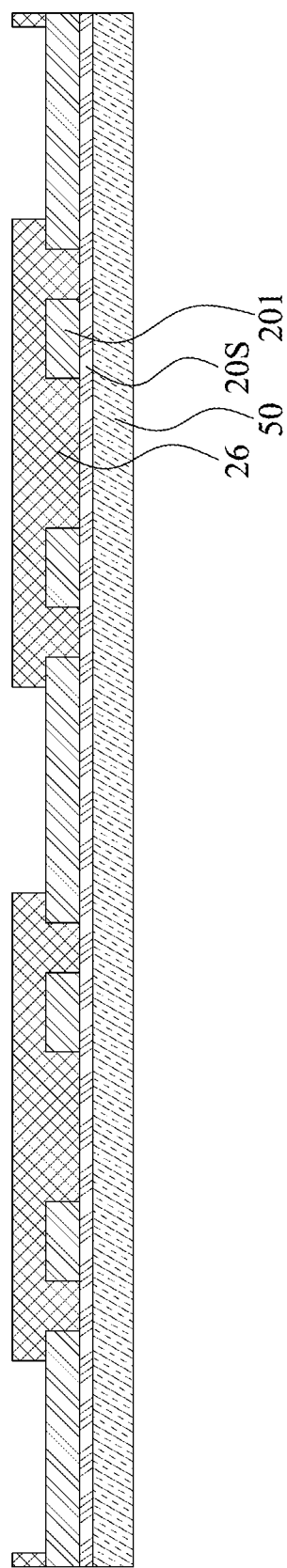
FIG. 4A, FIG. 4B, FIG. 4C, FIG. 4D and FIG. 4E illustrate operations of manufacturing an electronic package in accordance with some embodiments of the present disclosure.

FIG. 4A, FIG. 4B, FIG. 4C, FIG. 4D and FIG. 4E illustrate operations of manufacturing an electronic package 2 in accordance with some embodiments of the present disclosure. As shown in FIG. 4A, a first conductive layer 201 is formed on a temporary carrier 50. In some embodiments, the first conductive layer 201 may include a metal layer such as a copper layer, and can be formed by electroplating using a seed layer 20S. Subsequently, an insulative layer 26 such as a solder mask is formed to partially cover the first conductive layer 201.

Figure 4B:
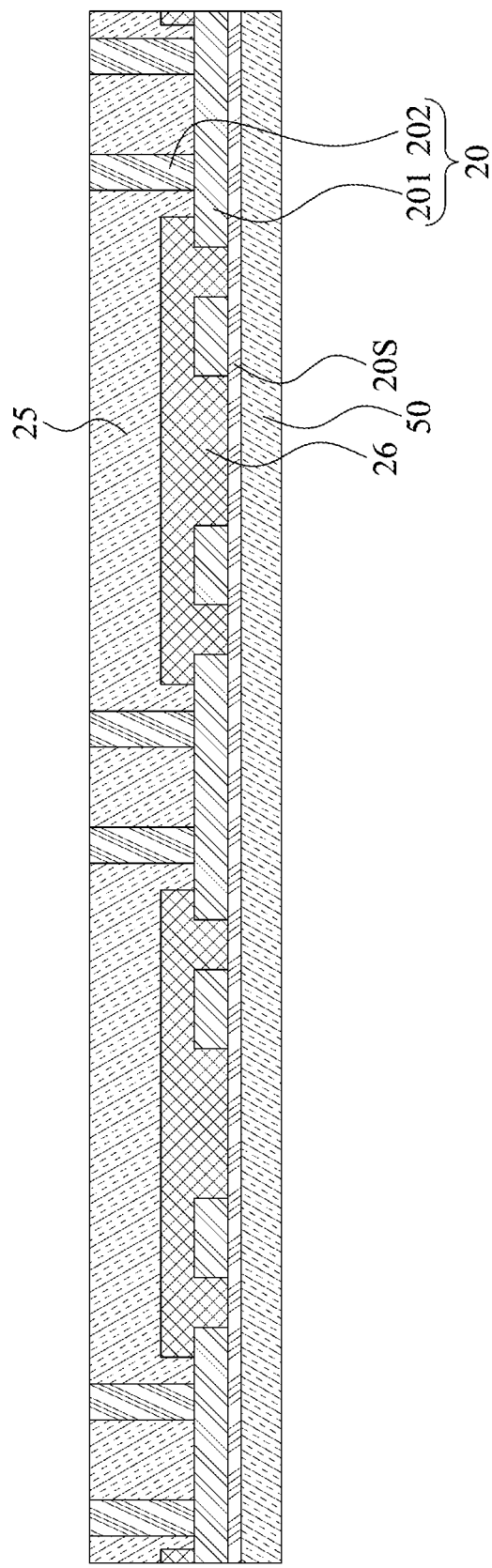

As shown in FIG. 4B, a sacrificial layer 25 made of e.g., photoresist may be formed on the insulative layer 26 to partially cover the first conductive layer 201. A second conductive layer 202 is then formed on the exposed first conductive layer 201. In some embodiments, the second conductive layer 202 may include a metal layer such as a copper layer, and can be formed by electroplating. Accordingly, the stack of conductive layers e.g., the first conductive layer 201 and the second conductive layer 202 defines a plurality of conductive step structures 20.

Figure 4C:
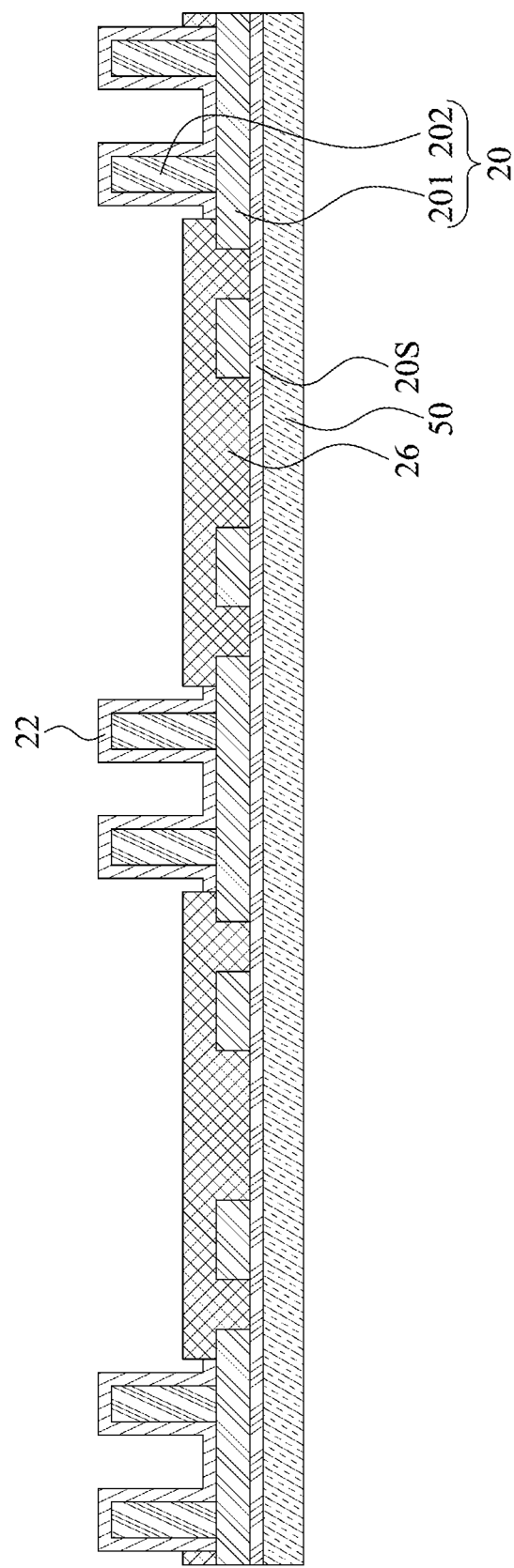

As shown in FIG. 4C, the sacrificial layer 25 is removed. A wetting layer 22 is then formed on the second conductive layer 202 and the first conductive layer 201 exposed by the insulative layer 26. In some embodiments, the wetting layer 22 may include a single-layered wetting layer. By way of example, the wetting layer 22 may include an organic solderability preservative (OSP). Alternatively or additionally, the wetting layer 22 includes a solder-wettable material such as nickel/gold, solder or a mixture thereof. In some other embodiments, the wetting layer 22 may include a multi-layered wetting layer.

Figure 4D:
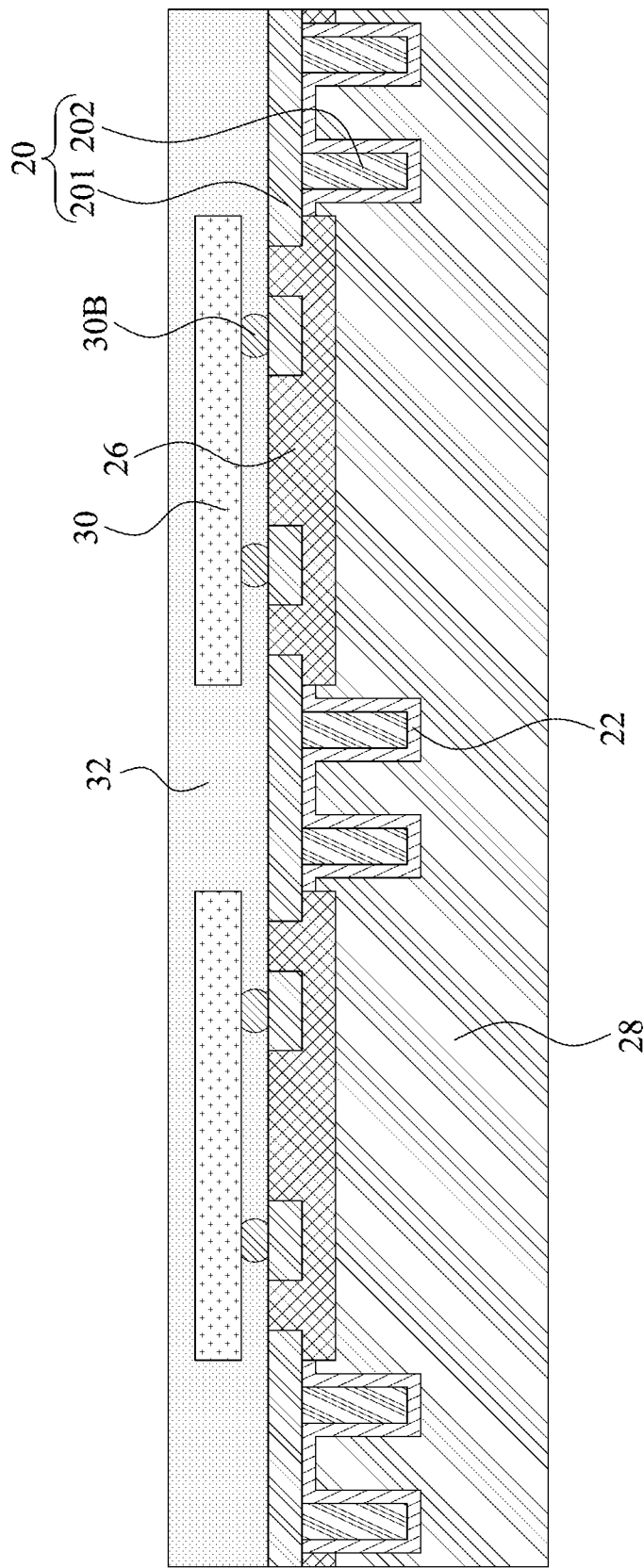

As shown in FIG. 4D, a supporting layer 28 is formed on the insulative layer 26 and the wetting layer 22 to support the conductive step structures 20. In some embodiments, the supporting layer 28 may include a metal layer such as a copper layer, and can be formed by electroplating. The temporary carrier 50 is removed. The seed layer 20S is removed from the first conductive layer 201 by, e.g., etching or the like. Subsequently, at least one first electronic component 30 is disposed on the first conductive layer 201. The first electronic component 30 may be electrically connected to the first conductive layer 201 through solder bumps 30B. A first encapsulant 32 is formed to encapsulate the at least one first electronic component 30 on the first conductive layer 201.

Figure 4E:
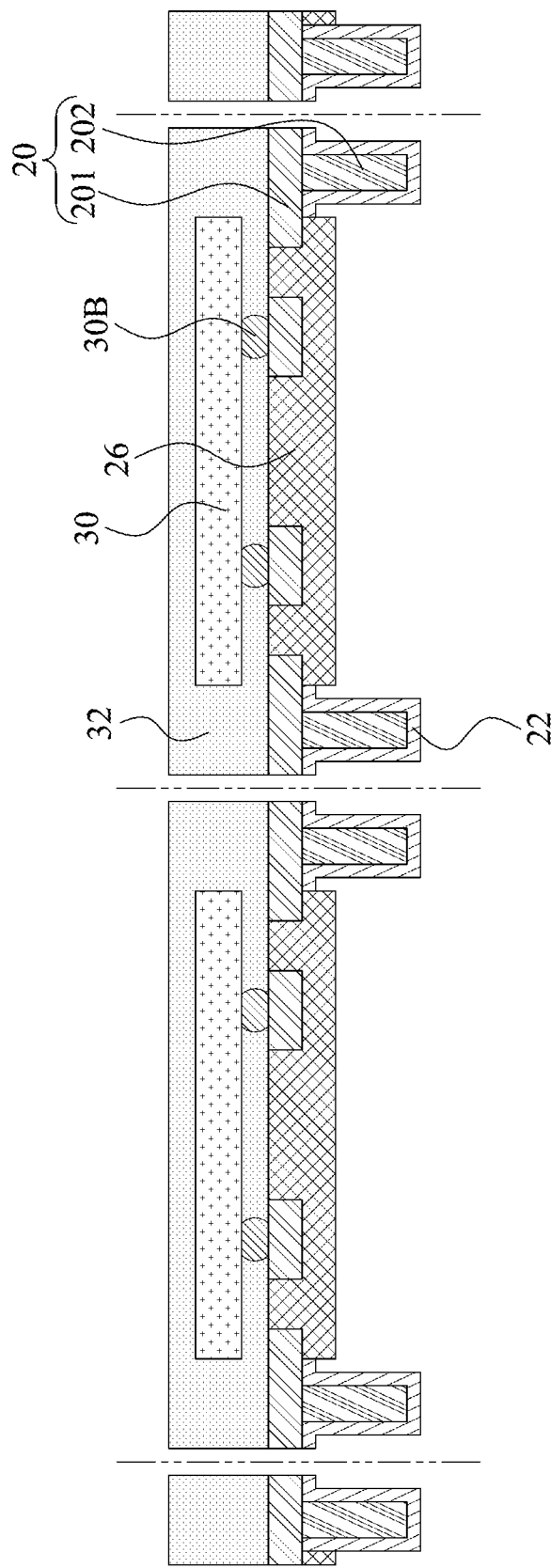

As shown in FIG. 4E, the supporting layer 28 may be removed after the first encapsulant 32 is formed. In some embodiments, the supporting layer 28 can be removed by e.g., etching. The stack of the first conductive layer 201 and the second conductive layer 202 is then singulated along the conductive step structure 20, and bonded to a circuit board 60 by solder conductors 62 to form an electronic package 2 with the conductive step structure 20 as illustrated in FIG. 3. Alternatively, the electronic package 2A as illustrated in FIG. 3A can be formed in case a multi-layered wetting layer is formed.

Figure 5:
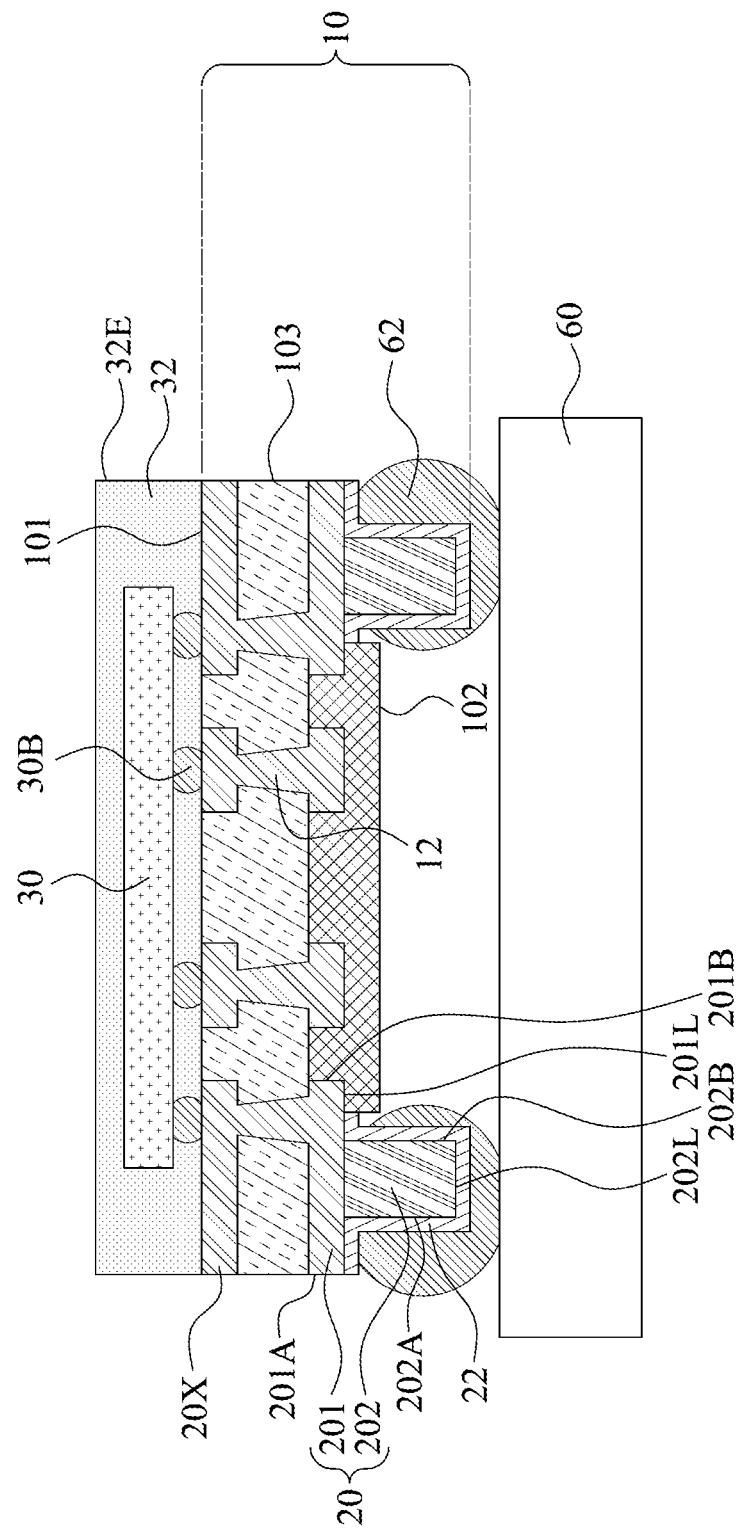
FIG. 5 is a schematic cross-sectional view of an electronic package in accordance with some embodiments of the present disclosure.

FIG. 5 is a schematic cross-sectional view of an electronic package 3 in accordance with some embodiments of the present disclosure. As shown in FIG. 5, in contrast to the electronic package 2 of FIG. 3, the circuit layer 12 may include a multi-layered circuit layer. By way of example, the substrate 10 may include a two-layered embedded trace substrate (ETS) having two layered circuit layer 12. In some embodiments, the circuit layer 12 may include a base conductive layer 20X, a first conductive layer 201 and a second conductive layer 202.

Figure 5A:
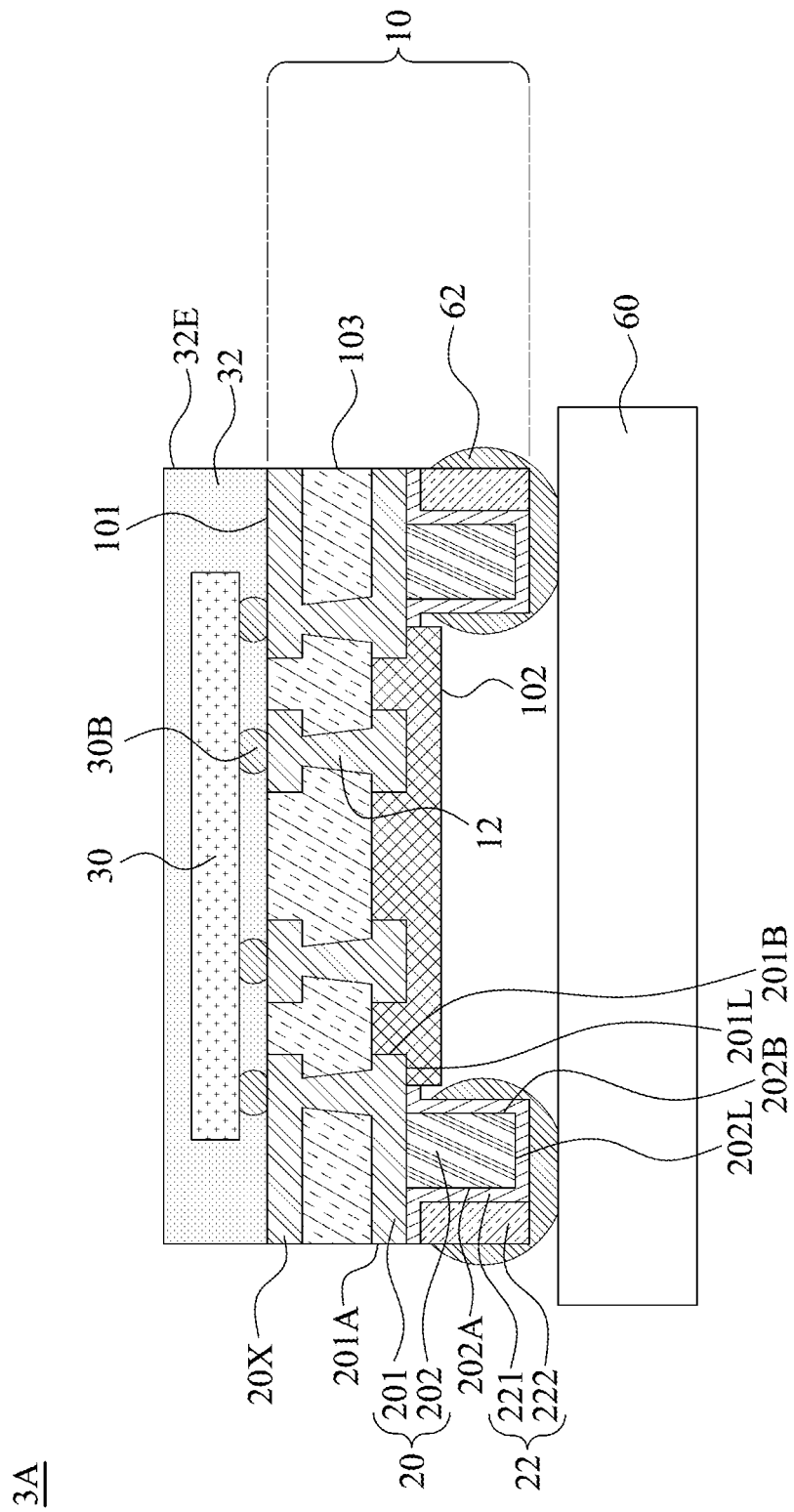
FIG. 5A is a schematic cross-sectional view of an electronic package 3 in accordance with some embodiments of the present disclosure.

FIG. 5A is a schematic cross-sectional view of an electronic package 3A in accordance with some embodiments of the present disclosure. As shown in FIG. 5A, in contrast to the electronic package 3 of FIG. 5, the wetting layer 22 may include a multi-layered wetting layer including a first wetting layer 221 and a second wetting layer 222. The first wetting layer 221 and the second wetting layer 222 may include different materials. By way of example, the first wetting layer 221 may include an organic solderability preservative (OSP), and the second wetting layer 222 may include a solder-wettable material such as nickel/gold, solder or a mixture thereof. In some embodiments, the first wetting layer 221 may cover at least a portion of the first bottom surface 201L of the first conductive layer 201, and the second bottom surface 202L, the second outer surface 202A and the second inner surface 202B of the second conductive layer 202. By way of example, the first wetting layer 221 may directly contact a portion of the first bottom surface 201L of the first conductive layer 201, and the second bottom surface 202L, the second outer surface 202A and the second inner surface 202B of the second conductive layer 202. The second wetting layer 222 may cover a portion of the first bottom surface 201L of the first conductive layer 201 and the second outer surface 202B of the second conductive layer 202. In an embodiment, in case the second wetting layer 222 includes solder material, the second wetting layer 222 and the respective solder conductor 62 may melt during the reflow process of the solder conductors 62, and then solidify as one conductor.

Figure 6A:
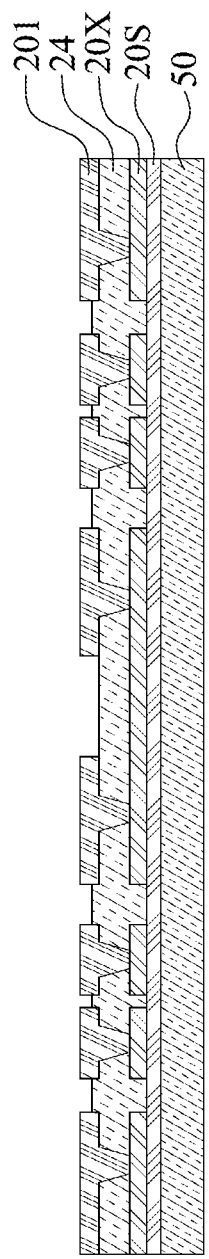
FIG. 6A, FIG. 6B, FIG. 6C, FIG. 6D and FIG. 6E illustrate operations of manufacturing an electronic package in accordance with some embodiments of the present disclosure.

FIG. 6A, FIG. 6B, FIG. 6C, FIG. 6D and FIG. 6E illustrate operations of manufacturing an electronic package 3 in accordance with some embodiments of the present disclosure. As shown in FIG. 6A, a base conductive layer 20X is formed on a temporary carrier 50. In some embodiments, the base conductive layer 20X may include a metal layer such as a copper layer, and can be formed by electroplating using a seed layer 20S. Subsequently, a dielectric layer 24 is formed to partially cover the base conductive layer 20X. Subsequently, a first conductive layer 201 is formed on the base conductive layer 20X exposed by the dielectric layer 24. In some embodiments, the first conductive layer 201 may include a metal layer such as a copper layer, and can be formed by electroplating.

Figure 6B:
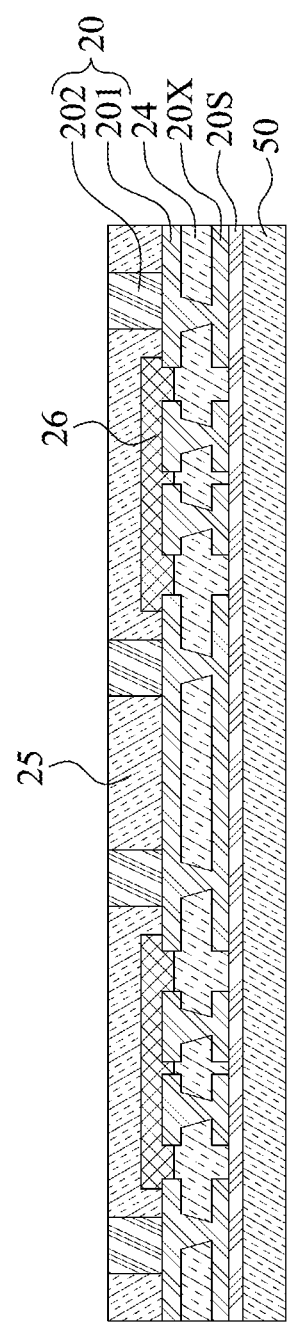

As shown in FIG. 6B, an insulative layer 26 such as solder mask is formed to partially cover the first conductive layer 201. A sacrificial layer 25 may be then formed on the insulative layer 26 to partially cover the first conductive layer 201. A second conductive layer 202 is then formed on the exposed first conductive layer 201. In some embodiments, the second conductive layer 202 may include a metal layer such as a copper layer, and can be formed by electroplating. Accordingly, the stack of conductive layers e.g., the first conductive layer 201 and the second conductive layer 202 defines a plurality of conductive step structures 20.

Figure 6C:
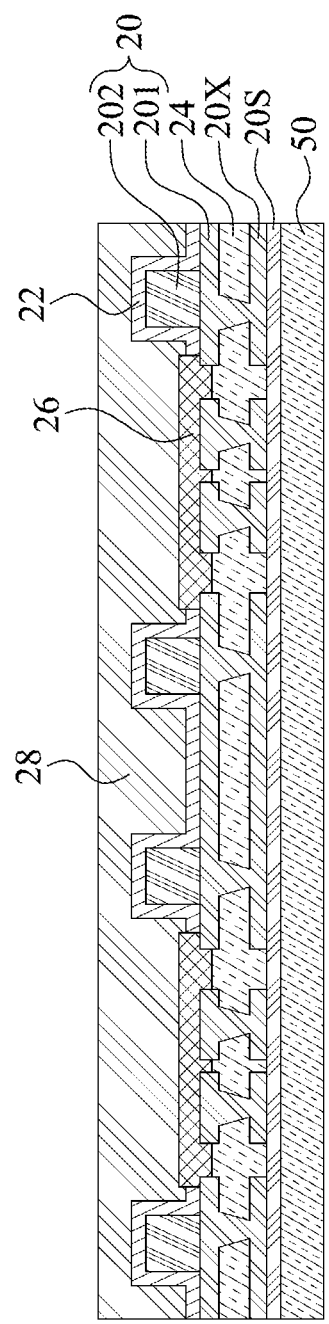

As shown in FIG. 6C, the sacrificial layer 25 is removed. A wetting layer 22 is then formed on the second conductive layer 202 and the first conductive layer 201 exposed by the insulative layer 26. In some embodiments, the wetting layer 22 may include a single-layered wetting layer. By way of example, the wetting layer 22 may include an organic solderability preservative (OSP). Alternatively or additionally, the wetting layer 22 includes a solder-wettable material such as nickel/gold, solder or a mixture thereof. In some other embodiments, the wetting layer 22 may include a multi-layered wetting layer. Subsequently, a supporting layer 28 is formed on the insulative layer 26 and the wetting layer 22 to support the conductive step structures 20. In some embodiments, the supporting layer 28 may include a metal layer such as a copper layer, and can be formed by electroplating.

Figure 6D:
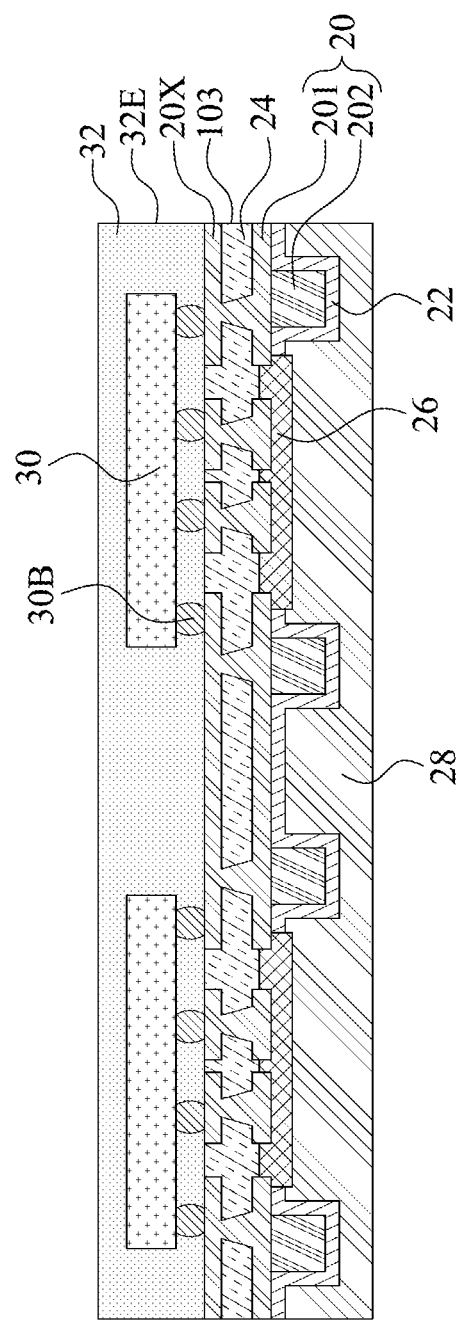
Figure 6E:
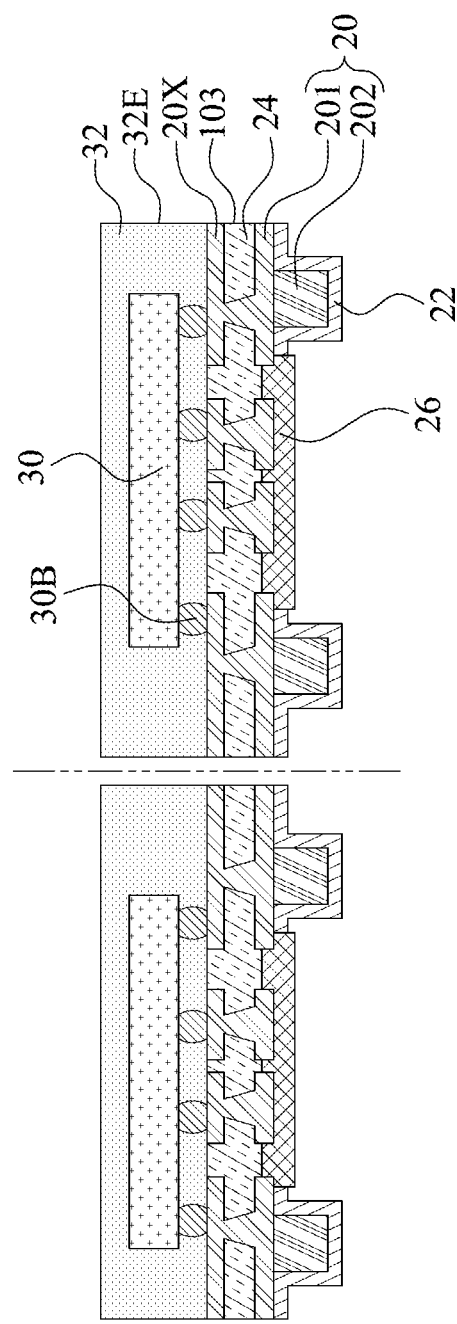

As shown in FIG. 6D, the temporary carrier 50 is removed. The seed layer 20S is removed from the first conductive layer 201 by, e.g., etching or the like. Subsequently, at least one first electronic component 30 is disposed on the base conductive layer 20X. The first electronic component 30 may be electrically connected to the base conductive layer 20X through solder bumps 30B. A first encapsulant 32 is formed to encapsulate the at least one first electronic component 30 on the base conductive layer 20X As shown in FIG. 6E, the supporting layer 28 may be removed after the first encapsulant 32 is formed. In some embodiments, the supporting layer 28 can be removed by e.g., etching. The stack of the first conductive layer 201 and the second conductive layer 202 is then singulated along the conductive step structure 20, and bonded to a circuit board 60 by solder conductors 62 to form an electronic package 3 with the conductive step structure 2 as illustrated in FIG. 5.

Alternatively, the electronic package 3A as illustrated in FIG. 5A can be formed in case a multi-layered wetting layer is formed.

Figure 7:
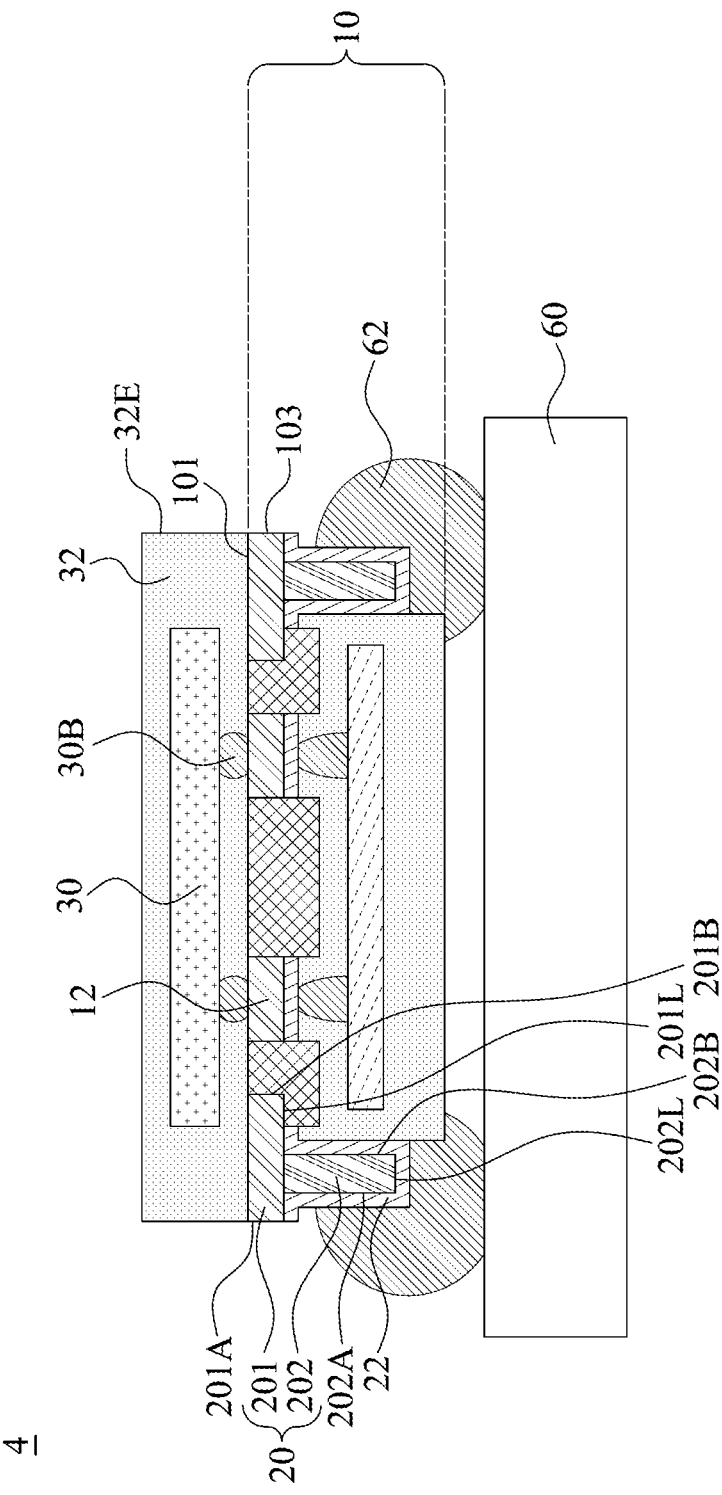
FIG. 7 is a schematic cross-sectional view of an electronic package in accordance with some embodiments of the present disclosure.

FIG. 7 is a schematic cross-sectional view of an electronic package 4 in accordance with some embodiments of the present disclosure. As shown in FIG. 7, in contrast to the electronic package 2 of FIG. 3, the electronic package 4 is a double-sided molding (DSM) package. The electronic package 4 further includes at least one second electronic component 70 disposed on the bottom surface 102 of the substrate 10, and electrically connected to the circuit layer 12. The second electronic component 70 may be electrically connected to the circuit layer through solder bumps 70B. The second electronic component 70 is disposed in a cavity 20C defined by the conductive step structures 20, and thus an overall thickness of the electronic package 4 can be reduced. The electronic package 4 further includes a second encapsulant 72 disposed on the bottom surface 102 of the substrate 10 and encapsulating the at least one second electronic component 70. In some embodiments, the second encapsulant 72 protrudes out from the second conductive layer 202. In some embodiments, the second encapsulant 72 may be substantially coplanar with the bottom surface of the wetting layer 22.

Figure 7A:
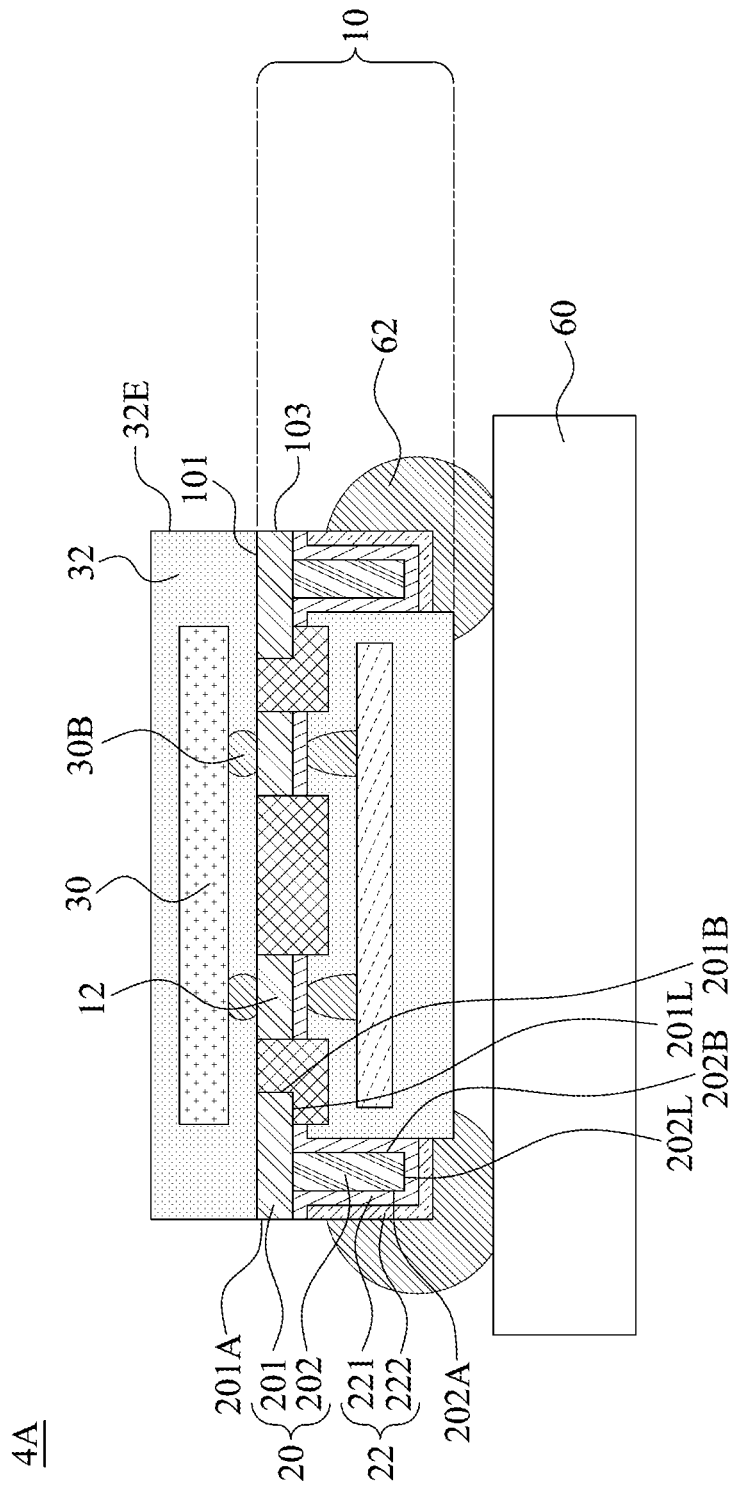
FIG. 7A is a schematic cross-sectional view of an electronic package in accordance with some embodiments of the present disclosure.

FIG. 7A is a schematic cross-sectional view of an electronic package 4A in accordance with some embodiments of the present disclosure. As shown in FIG. 7A, in contrast to the electronic package 4 of FIG. 7, the wetting layer 22 may include a multi-layered wetting layer including a first wetting layer 221 and a second wetting layer 222. The first wetting layer 221 and the second wetting layer 222 may include different materials. By way of example, the first wetting layer 221 may include an organic solderability preservative (OSP), and the second wetting layer 222 may include a solder-wettable material such as nickel/gold, solder or a mixture thereof. In some embodiments, the first wetting layer 221 may cover at least a portion of the first bottom surface 201L of the first conductive layer 201, and the second bottom surface 202L, the second outer surface 202A and the second inner surface 202B of the second conductive layer 202. By way of example, the first wetting layer 221 may directly contact a portion of the first bottom surface 201L of the first conductive layer 201, and the second bottom surface 202L, the second outer surface 202A and the second inner surface 202B of the second conductive layer 202. The second wetting layer 222 may cover a portion of the first bottom surface 201L of the first conductive layer 201 and the second outer surface 202B of the second conductive layer 202. In some embodiments, the second wetting layer 222 and the second encapsulant 72 are substantially coplanar. In an embodiment, in case the second wetting layer 222 includes solder material, the second wetting layer 222 and the respective solder conductor 62 may melt during the reflow process of the solder conductors 62, and then solidify as one conductor.

Figure 8B:
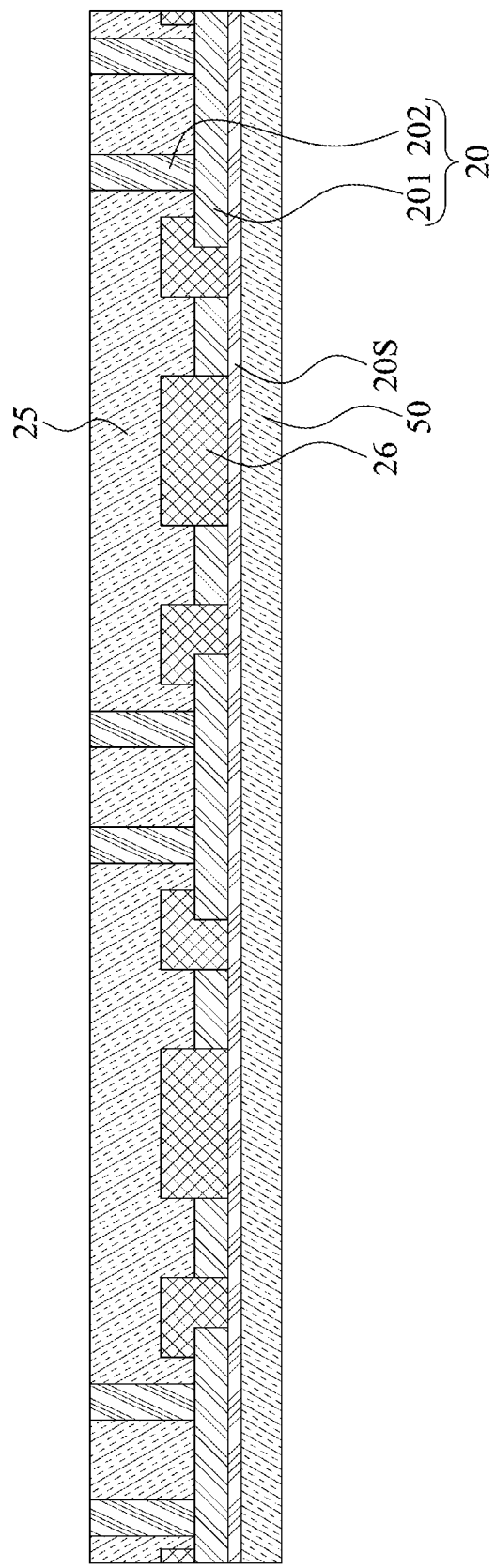

FIG. 8A, FIG. 8B, FIG. 8C, FIG. 8D and FIG. 8E illustrate operations of manufacturing an electronic package 4 in accordance with some embodiments of the present disclosure. As shown in FIG. 8A, a first conductive layer 201 is formed on a temporary carrier 50. Subsequently, an insulative layer 26 such as a solder mask is formed to partially cover the first conductive layer 201.

As shown in FIG. 8B, a sacrificial layer 25 may be formed on the insulative layer 26 to partially cover the first conductive layer 201. A second conductive layer 202 is then formed on the exposed first conductive layer 201. The stack of the first conductive layer 201 and the second conductive layer 202 defines a plurality of conductive step structures 20. In some embodiments, each of the conductive step structures 20 includes two conductive pillars of the second conductive layer 202 protruding out from the first conductive layer 201, and a gap is formed between the conductive pillars.

Figure 8C:
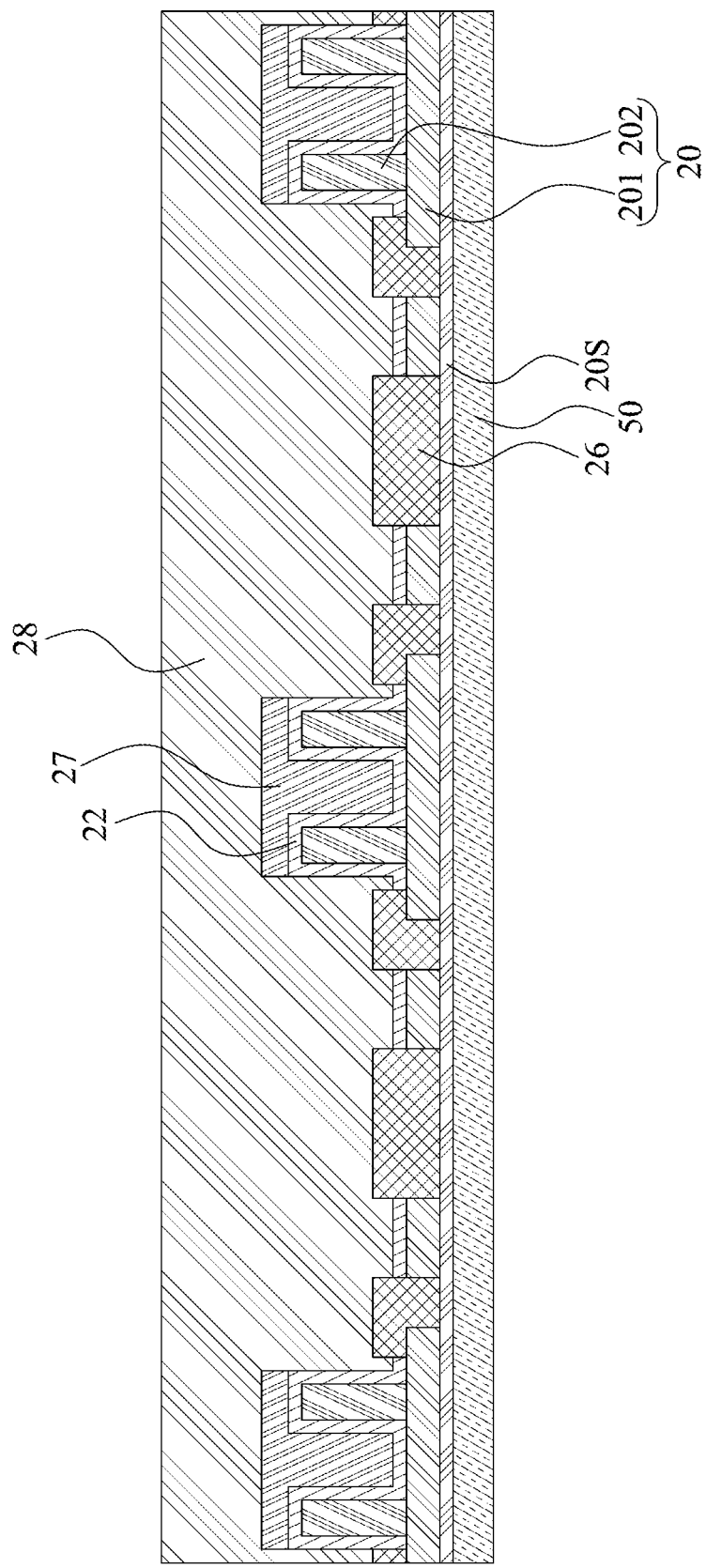

As shown in FIG. 8C, the sacrificial layer 25 is removed. A wetting layer 22 is then formed on the second conductive layer 202 and the first conductive layer 201 exposed by the insulative layer 26. In some embodiments, the wetting layer 22 may include a single-layered wetting layer. By way of example, the wetting layer 22 may include an organic solderability preservative (OSP). Alternatively or additionally, the wetting layer 22 includes a solder-wettable material such as nickel/gold, solder or a mixture thereof. In some other embodiments, the wetting layer 22 may include a multi-layered wetting layer. Subsequently, another sacrificial layer 27 is formed to partially cover the wetting layer 22 and fill in the gap between the conductive pillars. The sacrificial layer 27 may include a releasable film or the like. Following that, a supporting layer 28 is formed on the insulative layer 26, the wetting layer 22 and the sacrificial layer 27 to support the conductive step structures 20. In some embodiments, the supporting layer 28 may include a metal layer such as a copper layer, and can be formed by electroplating.

Figure 8D:
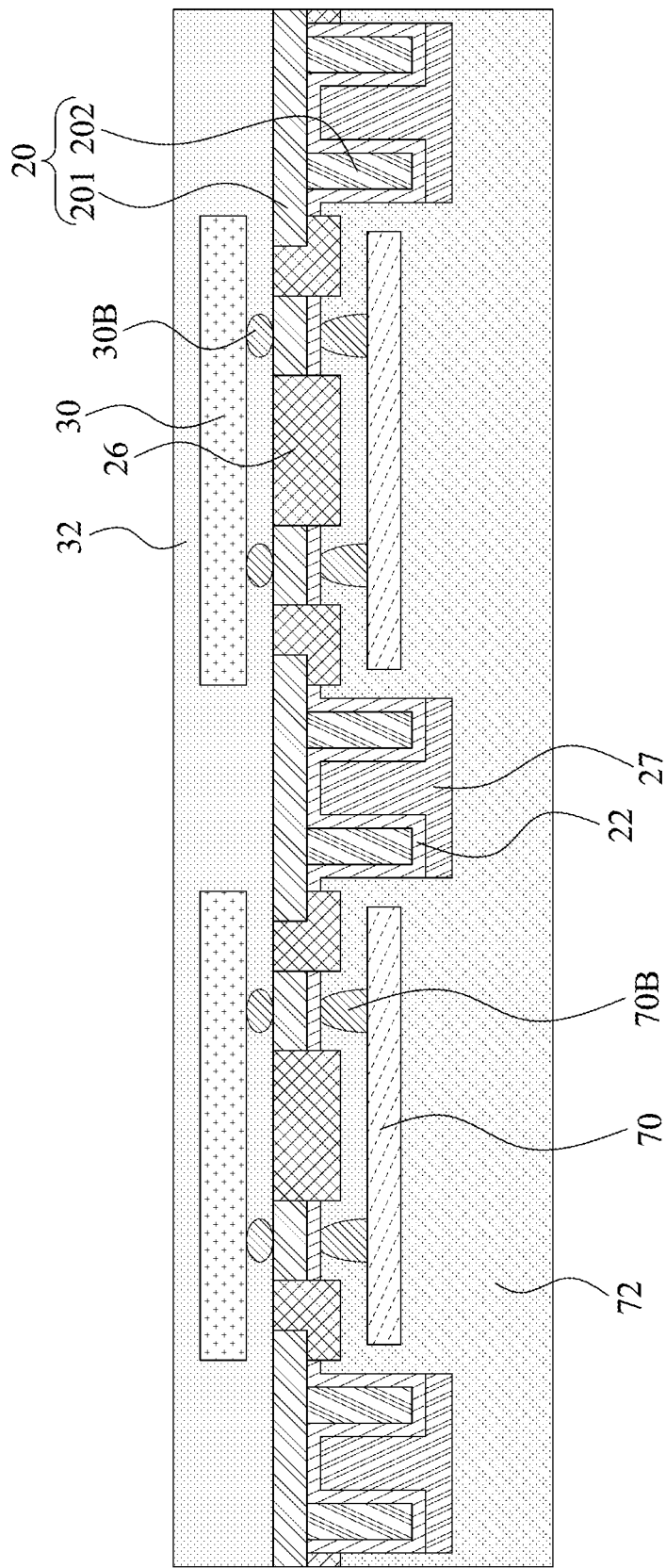

As shown in FIG. 8D, the temporary carrier 50 and the seed layer 20S are removed from the first conductive layer 201. Subsequently, at least one first electronic component 30 is disposed on the first conductive layer 201, and a first encapsulant 32 is formed to encapsulate the at least one first electronic component 30 on the first conductive layer 201. The supporting layer 28 may be removed after the first encapsulant 32 is formed. At least one second electronic component 70 is disposed on the bottom surface 102 of the substrate 10, and electrically connected to the circuit layer 12 through solder bumps 70B. A second encapsulant 72 is formed on the bottom surface 102 of the substrate 10 to encapsulate the at least one second electronic component 70. In some embodiments, the second encapsulant 72 is thinned by e.g., grinding to expose the sacrificial layer 27, and the sacrificial layer 27 is then removed. The sacrificial layer 27 is configured to protect the wetting layer 22 from contacting the molding material of the second encapsulant 72, and thus the wetting layer 22 can be exposed from the second encapsulant 72 without being damaged. In addition, the second encapsulant 72 is not leveled with the wetting layer 22 after the grinding process because the sacrificial layer 27 covers the wetting layer 22 during the grinding process. In some alternative embodiments, the sacrificial layer 27 may be replaced with a second wetting layer such as solder-wettable material. The second wetting layer may cover the second bottom surface 202L and configured as stop layer during the grinding process. In such a case, the second wetting layer and the second encapsulant 72 will be substantially coplanar after the grinding process.

Figure 8E:
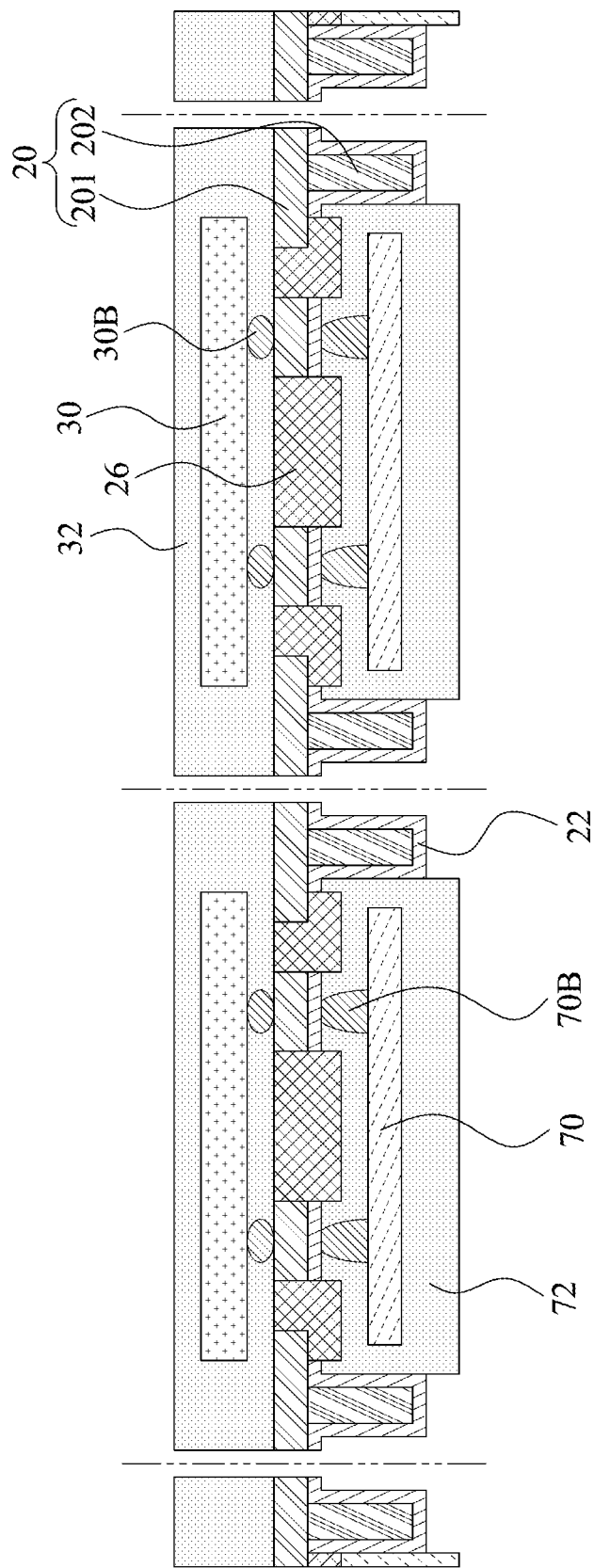

As shown in FIG. 8E, the stack of the first conductive layer 201 and the second conductive layer 202 is then singulated along the conductive step structure 20 between the two conductive pillars, and bonded to a circuit board 60 by solder conductors 62 to form an electronic package 4 with the conductive step structure 20 as illustrated in FIG. 7. Alternatively, the electronic package 4A as illustrated in FIG. 7A can be formed in case a multi-layered wetting layer is formed. In some embodiments, the second encapsulant 72 may be substantially coplanar with the bottom surface of the wetting layer 22.

Figure 9:
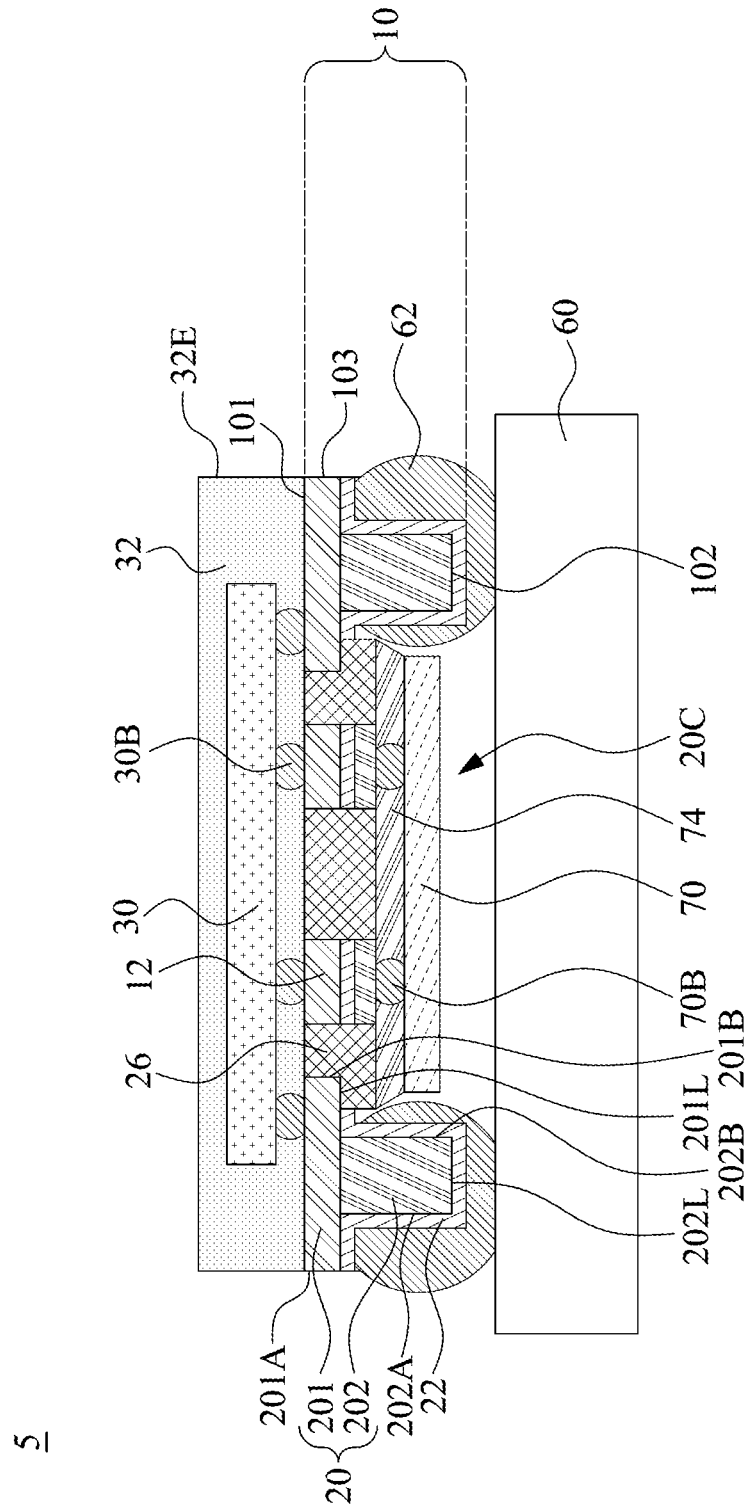
FIG. 9 is a schematic cross-sectional view of an electronic package in accordance with some embodiments of the present disclosure.

FIG. 9 is a schematic cross-sectional view of an electronic package 5 in accordance with some embodiments of the present disclosure. As shown in FIG. 9, in contrast to the electronic package 4 of FIG. 7, the second encapsulant 70 of the electronic package 5 may, but is not limited to, be omitted. An underfill 74 may be disposed between the second electronic component 70 and the circuit layer 12.

Figure 9A:
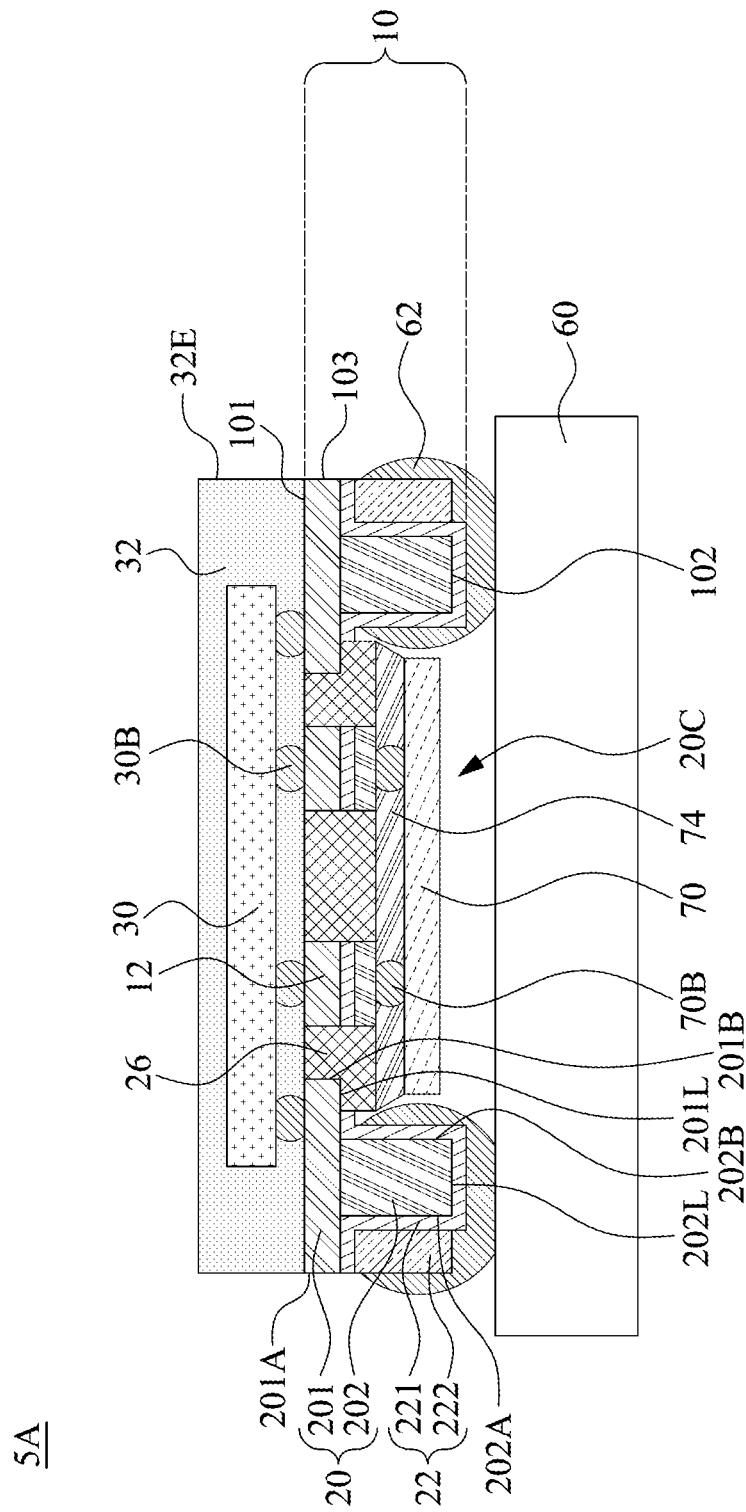
FIG. 9A is a schematic cross-sectional view of an electronic package in accordance with some embodiments of the present disclosure.

FIG. 9A is a schematic cross-sectional view of an electronic package 5A in accordance with some embodiments of the present disclosure. As shown in FIG. 9A, in contrast to the electronic package 5 of FIG. 9, the wetting layer 22 may include a multi-layered wetting layer including a first wetting layer 221 and a second wetting layer 222. The first wetting layer 221 and the second wetting layer 222 may include different materials. By way of example, the first wetting layer 221 may include an organic solderability preservative (OSP), and the second wetting layer 222 may include a solder-wettable material such as nickel/gold, solder or a mixture thereof. In an embodiment, in case the second wetting layer 222 includes solder material, the second wetting layer 222 and the respective solder conductor 62 may melt during the reflow process of the solder conductors 62, and then solidify as one conductor.

Figure 10A:
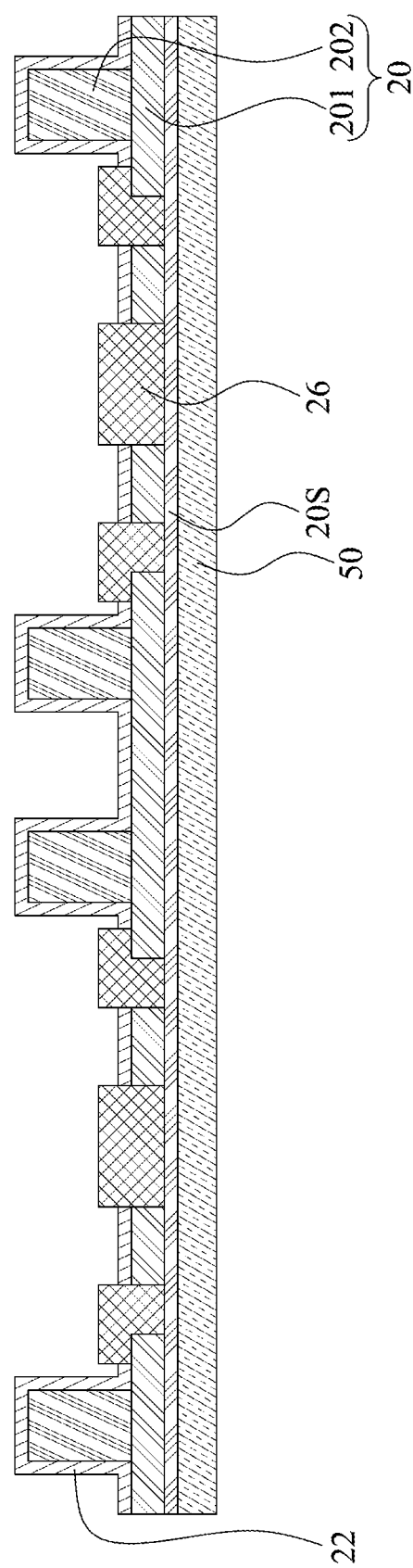
FIG. 10A, FIG. 10B, FIG. 10C and FIG. 10D illustrate operations of manufacturing an electronic package in accordance with some embodiments of the present disclosure.

FIG. 10A, FIG. 10B, FIG. 10C and FIG. 10D illustrate operations of manufacturing an electronic package 5 in accordance with some embodiments of the present disclosure. As shown in FIG. 10A, a first conductive layer 201 is formed on a temporary carrier 50. Subsequently, an insulative layer 26 such as a solder mask is formed to partially cover the first conductive layer 201. Then, a second conductive layer 202 is then formed on the first conductive layer 201 using a sacrificial layer (not shown) to define the pattern of the second conductive layer 202. The stack of the first conductive layer 201 and the second conductive layer 202 defines a plurality of conductive step structures 20. Following that, a first wetting layer 221 is then formed on the second conductive layer 202 and the first conductive layer 201 exposed by the insulative layer 26. By way of example, the first wetting layer 221 may include an organic solderability preservative (OSP)

Figure 10B:
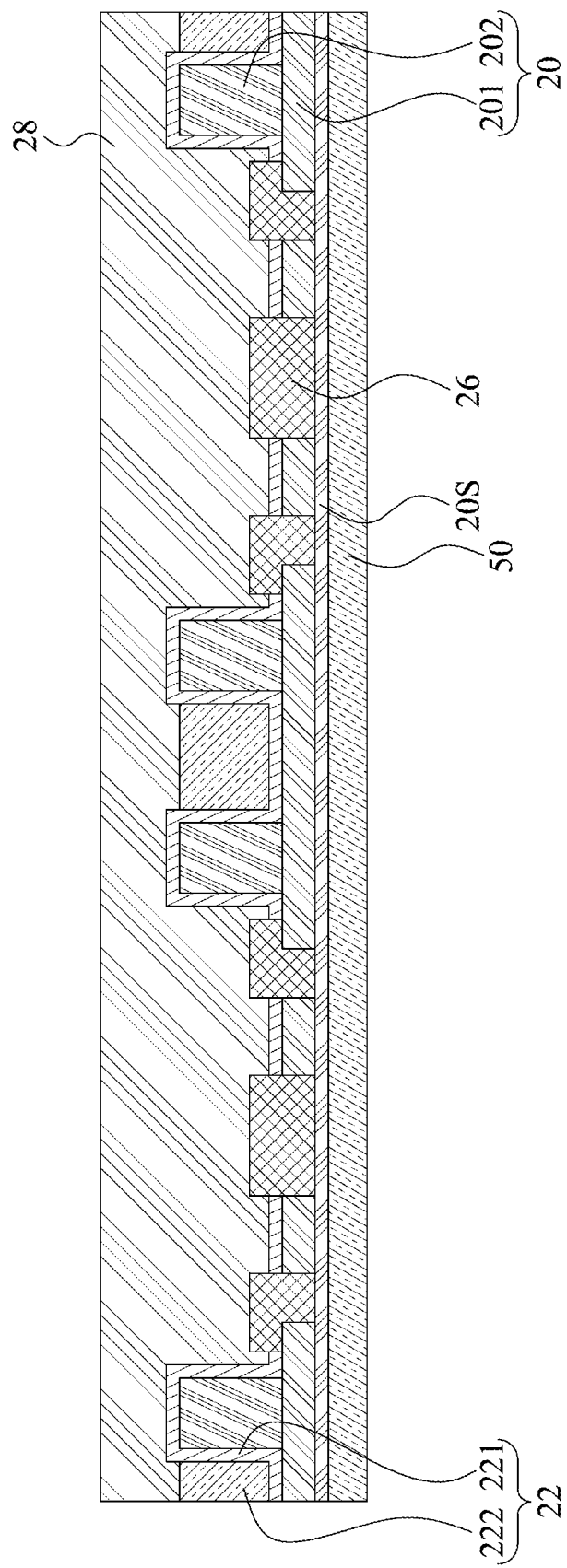

As shown in FIG. 10B, a second wetting layer 222 is formed on the first wetting layer 221 between the conductive pillars of the second conductive layer 202. By way of example, the second wetting layer 222 includes a solder-wettable material such as nickel/gold, solder or a mixture thereof. Subsequently, a supporting layer 28 is formed on the insulative layer 26 and the wetting layer 22 to support the conductive step structures 20. In some embodiments, the supporting layer 28 may include a metal layer such as a copper layer, and can be formed by electroplating.

Figure 10C:
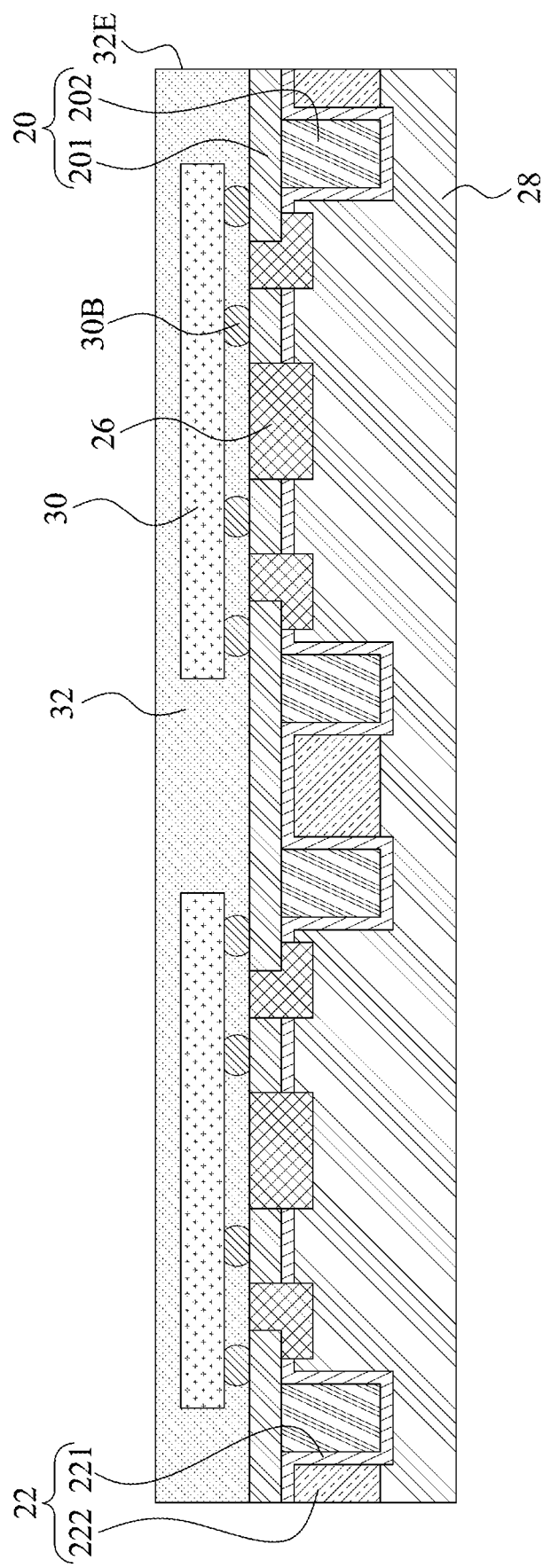

As shown in FIG. 10C, the temporary carrier 50 and the seed layer 20S are removed from the first conductive layer 201. Subsequently, at least one first electronic component 30 is disposed on the first conductive layer 201, and a first encapsulant 32 is formed to encapsulate the at least one first electronic component 30 on the first conductive layer 201.

Figure 10D:
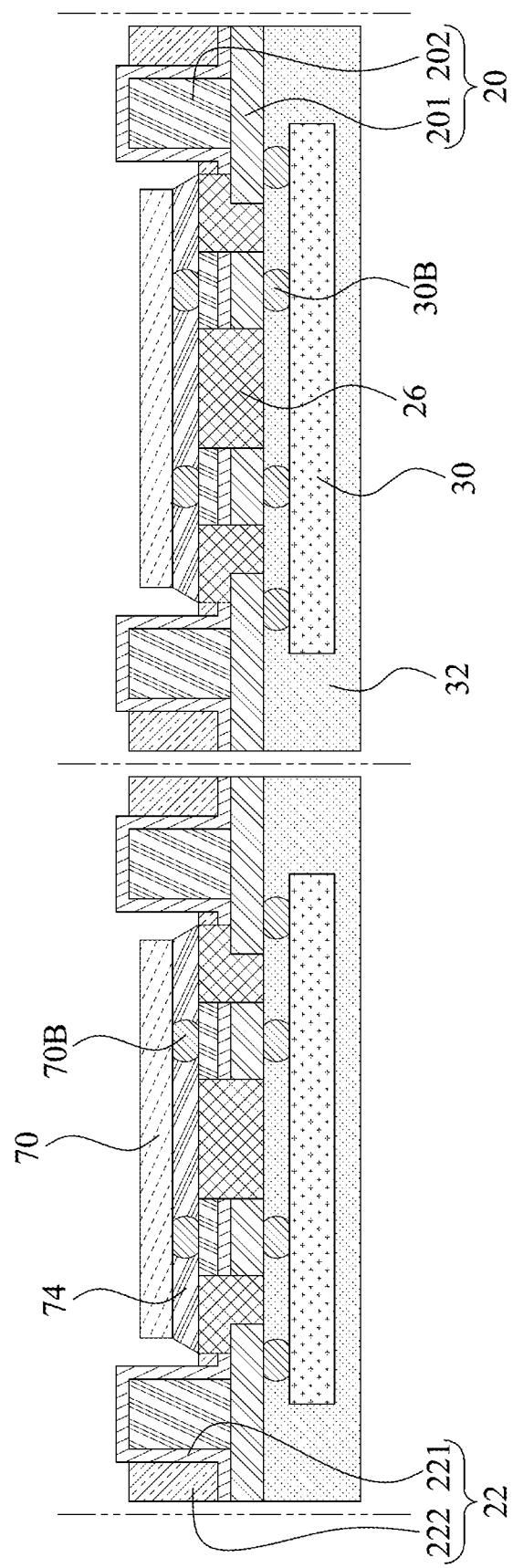

As shown in FIG. 10D, the supporting layer 28 may be removed after the first encapsulant 32 is formed by e.g., etching. In some embodiments, a portion of the supporting layer 28 may be reserved and configured as bonding pads. Then, at least one second electronic component 70 is disposed on the bottom surface 102 of the substrate 10, and electrically connected to the remaining supporting layer 28 through solder bumps 70B. In some embodiments, an underfill 74 may be formed between the second electronic component 70 and the circuit layer 12. The stack of the first conductive layer 201 and the second conductive layer 202 is then singulated along the conductive step structure 20 between the two conductive pillars, and bonded to a circuit board 60 by solder conductors 62 to form an electronic package 5A as illustrated in FIG. 9A. Alternatively, the electronic package 5 as illustrated in FIG. 9 can be formed in case the second wetting layer 222 is omitted.

In some embodiments of the present disclosure, the electronic package includes conductive step structures configured as wettable flanks. The conductive step structures are formed by additive process rather than subtractive process. Accordingly, the wettable flanks have high consistency and reliability.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic package, comprising:
    a substrate comprising a plurality of conductive step structures each including a first portion and a second portion, the first portion having a first bottom surface, a first outer surface and a first inner surface, and the second portion having a second bottom surface, a second outer surface and a second inner surface, wherein the second portion partially exposes the first bottom surface; and
    a wetting layer at least covering the second bottom surface, the second outer surface and the second inner surface of the second portion of each of the conductive step structures;
    wherein the substrate further comprises a circuit layer electrically connected to the conductive step structures;
    wherein the conductive step structures define a cavity on a bottom surface of the substrate, and a portion of the circuit layer is exposed from the bottom surface of the substrate.

2. The electronic package according to claim 1, wherein the wetting layer exposes the first outer surface and the first inner surface.

3. The electronic package according to claim 1, wherein the wetting layer further directly contact a portion of the first bottom surface.

4. The electronic package according to claim 1, wherein the wetting layer comprises a multi-layered wetting layer including a first wetting layer and a second wetting layer.

5. The electronic package according to claim 4, wherein the first wetting layer covers at least a portion of the first bottom surface, and the second bottom surface, the second outer surface and the second inner surface.

6. The electronic package according to claim 5, wherein the second wetting layer covers the second outer surface and a portion of the first bottom surface.

7. The electronic package according to claim 6, wherein the second wetting layer further covers the second bottom surface.

8. The electronic package according to claim 1, wherein a portion of the circuit layer is exposed from a front surface of the substrate.

9. The electronic package according to claim 8, further comprising a first encapsulant disposed on the front surface of the substrate.

10. The electronic package according to claim 1, further comprising at least one electronic component disposed on the bottom surface of the substrate in the cavity, and electrically connected to the circuit layer.

11. The electronic package according to claim 10, further comprising a second encapsulant disposed on the bottom surface of the substrate and encapsulating the at least one electronic component.

12. The electronic package according to claim 1, wherein the first portion and the second portion of each of the plurality of conductive step structures are in direct contact with each other with an interface therebetween.

13. An electronic package, comprising:
    a substrate comprising a circuit layer including a stack of a first conductive layer and a second conductive layer, wherein the first conductive layer includes a first bottom surface and a first outer surface, the second conductive layer includes a second bottom surface and a second outer surface, the second conductive layer exposing a portion of the first bottom surface of the first conductive layer, thereby defining a conductive step structure,
    wherein the second outer surface and the second bottom surface form a conductive path;
    wherein the conductive step structure defines a cavity on a bottom surface of the substrate, and a portion of the circuit layer is exposed from the bottom surface of the substrate.

14. The electronic package according to claim 13, further comprising a wetting layer covering the second outer surface, the second bottom surface and a second inner surface of the second conductive layer.

15. The electronic package according to claim 13, wherein the first conductive layer and the second conductive layer are in direct contact with each other with an interface therebetween.

16. The electronic package according to claim 11, further comprising an electronic component disposed on a front surface of the substrate and electrically connected to the circuit layer.

17. An electronic package, comprising:
    a substrate comprising a circuit layer including a stack of a first conductive layer and a second conductive layer, wherein the first conductive layer includes a first bottom surface and a first outer surface, the second conductive layer includes a second bottom surface and a second outer surface, the second conductive layer exposing a portion of the first bottom surface of the first conductive layer, thereby defining a conductive step structure,
    wherein the second outer surface and the first bottom surface form a conductive path;
    wherein the conductive step structure defines a cavity on a bottom surface of the substrate, and a portion of the circuit layer is exposed from the bottom surface of the substrate.

18. The electronic package according to claim 17, wherein the conductive path further consisting of the second outer surface, the first bottom surface and the second bottom surface.

* * * * *

UNITED STATES PATENT AND TRADEMARK OFFICE
CERTIFICATE OF CORRECTION

| | |
|---|---|
| PATENT NO. | : 11,616,007 B2 |
| APPLICATION NO. | : 17/066411 |
| DATED | : March 28, 2023 |
| INVENTOR(S) | : You-Lung Yen, Bernd Karl Appelt and Kay Stefan Essig |

It is certified that error appears in the above-identified patent and that said Letters Patent is hereby corrected as shown below:

On the Title Page

The Inventor information should read as follows:
(72) Inventors: You-Lung Yen, Kaohsiung (TW);
Bernd Karl Appelt, Kaohsiung (TW);
Kay Stefan Essig, Kaohsiung (TW)

Signed and Sealed this
Ninth Day of May, 2023

Katherine Kelly Vidal
*Director of the United States Patent and Trademark Office*